(12) United States Patent
Hadas et al.

(10) Patent No.: US 7,821,840 B2
(45) Date of Patent: Oct. 26, 2010

(54) MULTI-PHASE PROGRAMMING OF MULTI-LEVEL MEMORY

(75) Inventors: Guy Hadas, Sunnyvale, CA (US); Darlene Gay Hamilton, White Salmon, WA (US); Fatima Bathul, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 148 days.

(21) Appl. No.: 12/276,604

(22) Filed: Nov. 24, 2008
(Under 37 CFR 1.47)

(65) Prior Publication Data
US 2010/0128524 A1    May 27, 2010

(51) Int. Cl.
*G11C 16/04* (2006.01)
(52) U.S. Cl. .............. 365/185.28; 365/185.02; 365/185.03; 365/185.19
(58) Field of Classification Search .............. 365/185.28
See application file for complete search history.

(56) References Cited

U.S. PATENT DOCUMENTS

| | | | |
|---|---|---|---|
| 6,738,289 B2 * | 5/2004 | Gongwer et al. ....... | 365/185.12 |
| 7,002,843 B2 * | 2/2006 | Guterman et al. ...... | 365/185.03 |
| 7,031,193 B2 * | 4/2006 | Micheloni et al. ...... | 365/185.22 |
| 7,468,907 B2 * | 12/2008 | Kang et al. ............ | 365/185.03 |
| 7,515,467 B2 * | 4/2009 | Yuda ..................... | 365/185.03 |
| 7,675,782 B2 * | 3/2010 | Cohen et al. ........... | 365/185.24 |
| 2008/0013374 A1 * | 1/2008 | Li et al. ................. | 365/185.03 |

* cited by examiner

*Primary Examiner*—Son L Mai
(74) *Attorney, Agent, or Firm*—Turocy & Watson, LLP

(57) ABSTRACT

Systems, methods, and devices that facilitate multi-phase programming of data in a memory component are presented. Received data is programmed to a memory using multiple programming phases based on a predefined program pattern. A program learn is performed by varying drain voltages, as desired, to facilitate determining respective drain voltages related to specified subgroups associated with respective data levels for a first programming phase. A first programming phase is performed using learned drain voltages as initial drain voltages where drain voltage levels are varied during each program pulse to facilitate programming memory cells to respective intrinsic verify voltage levels based on respective data levels. A second programming phase is performed using ending drain voltages from the first programming phase as initial drain voltages where gate voltage levels are varied during each program pulse to facilitate programming memory cells to respective final verify voltage levels based on respective data levels.

29 Claims, 13 Drawing Sheets

MULTI-PHASE PROGRAMMING OF MULTI-LEVEL MEMORY

TECHNICAL FIELD

The subject innovation relates generally to memory systems and in particular, to systems, methodologies, and devices that can facilitate efficient multi-phase programming of data to a memory comprising multi-level memory cells.

BACKGROUND

A wide variety of memory devices can be used to maintain and store data and instructions for various computers and similar systems. In particular, flash memory is a type of electronic memory media that can be rewritten and retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and/or NAND flash, for example. NOR flash evolved from electrically erasable read only memory (EEPROM) chip technology, in which, unlike flash, a single byte can be erased; and NAND flash evolved from DRAM technology. Flash memory devices can be less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory can be used in many portable electronic products, such as cellular phones, computers, voice recorders, thumbnail drives, and the like, as well as in many larger electronic systems, such as automobiles, airplanes, industrial control systems, etc. The fact that flash memory can be rewritten as well as its retention of data without a power source, small size and light weight have all combined to make flash memory devices a useful and popular means for transporting and maintaining data.

Flash memory typically comprises an array of nonvolatile memory cells wherein data (e.g., one or more bits of data) can be stored. One type of flash memory comprises multi-level memory cells (e.g., quad-level memory cells) where each level can be associated with a respective data state. The multi-level memory cells also can comprise more than one memory element in which data can be stored. For example, a quad-level flash memory cell can comprise two memory elements that each can be programmed to four levels resulting in a memory cell that can have sixteen available data states and can store four bits of data. Each level of a multi-level memory cell can have a respective region or window that is associated with a respective data state.

For example, in a quad-level memory cell, there can be a first level that can be an erase state, where a memory element that has a charge level stored therein that is less than a predetermined threshold voltage level corresponding to the end of the window for the first level can be in an erase state. A second level can be associated with a first program level (e.g., first program state), where the window for the first program level can be defined by an upper and a lower threshold voltage levels, where the lower threshold voltage level can be adjacent to the threshold voltage level corresponding to the upper bound of the window associated with the first level and the upper threshold voltage level can define the upper bound of the second level. A memory element with a charge level that falls between the upper and lower threshold levels for the window for the first program level can be programmed to the first program state (e.g., data level 2). A third data level can be associated with a second program level (e.g. second program state), where the window for the second program level can be defined by an upper and a lower threshold voltage levels, where the lower threshold voltage level can be adjacent to the threshold voltage level corresponding to the upper bound of the window associated with the second level and the upper threshold voltage level can define the upper bound of the third level. A memory element with a charge level that falls between the upper and lower threshold levels for the window for the second program level can be programmed to the second program state (e.g., data level 3). A fourth level can be associated with a third program level (e.g., third program state), where the window for the third program level can be defined by a lower threshold voltage level that can be adjacent to the threshold voltage level corresponding to the upper bound of the window associated with the third level. A memory element with a charge level that is higher than the lower threshold voltage level for the window for the third program level can be programmed to the third program state (e.g., data level 4).

Over time, as the memory is subject to erase cycles and/or other use that can cause wear to the memory, the read margins for each level can become smaller (e.g., the windows for each level can become smaller), which can result in data retention loss and/or read errors with regard to stored data. To facilitate improved programming of multi-level memory cells and reduction of data retention loss with regard to memory cells, it is desirable to employ programming techniques that can result in very tight threshold voltage distribution widths for each level of a multi-level memory cell.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems, methods, and devices that can employ multi-phase programming to facilitate efficiently programming multi-level memory cells (e.g., quad-bit memory cells) in a memory component. In one embodiment, a memory cell can comprise more than one memory element (e.g., two memory elements), where each memory element can employ more than two data levels (e.g. four data levels or data states). In one aspect, a memory component can include a multi-phase (MP) program component that can facilitate re-arranging (e.g., scrambling) data being programmed to memory cells in the memory component to arrange the data so that the data is programmed to the memory cells in accordance with a predefined program pattern that minimizes or substantially minimizes the difference in data levels (e.g., data states) between adjacent memory elements (e.g., memory elements adjacent to each other in the same memory cell, or a memory element of one memory cell that is adjacent to a memory element of another memory cell). For example, the predefined program pattern can re-arrange incoming data so that data corresponding to level 4 can be arranged adjacent to other data corresponding to level 4 or level 3, as opposed to level 2 or level 1, to facilitate reducing disturb between adjacent memory elements.

In another aspect, during multi-phase programming of data to the memory component, the memory component can receive data to be written to desired memory cells in the memory component and can store the received data in a buffer component. Before programming the data to the memory cells, the MP program component can perform a program learn to facilitate learning drain voltages levels that can be respectively associated with a memory element programmed to data level 2 when the complementary memory element is at level 1 (e.g., subgroup 21), a memory element programmed to data level 3 when the complementary memory element is at level 1 (e.g., subgroup 31), and a memory element programmed to data level 4 when the complementary memory element is at level 1 (e.g., subgroup 41), where the MP program component can learn respective drain voltage levels for each of subgroup 21, subgroup 31, and subgroup 41 to program respective memory elements to respective intrinsic voltage levels for data level 2, data level 3, and data level 4. To facilitate performing the program learn, the MP program component can set various program parameters, such as a starting gate voltage, a starting drain voltage, a source voltage, a pulse width, and a specified pattern being utilized. The MP program component can apply respective program pulses to program one word in memory cells according to the desired data levels, data level 2 (e.g., subgroup 21), data level 3 (e.g., subgroup 31), and data level 4 (e.g., subgroup 41) and can verify the respective voltage levels in the memory cells to determine whether the respective voltage levels for each data level meet the intrinsic pre-verify voltage levels respectively associated with the data levels. If after programming the word to the memory cells, one or more of the data levels meets its corresponding intrinsic pre-verify voltage level, the MP program component can record the drain voltage for such data level and the learn process can be complete with regard to a data level that is verified. For any data level that does not meet the desired intrinsic pre-verify voltage level (e.g., is not verified), the drain voltage can be incremented to a next drain voltage level, up to a predetermined maximum drain voltage level (or maximum number of program pulses), and a next program pulse can be applied to any remaining unverified data level(s) (e.g., data level that has not been verified to meet a respective intrinsic pre-verify voltage level) where the program learn process can continue until desired drain voltage levels are obtained and recorded for each data level (and related subgroup), or until a maximum drain voltage or maximum number of program pulses is reached, where if a maximum drain voltage or maximum number of program pulses is reached without verifying all subgroups, the MP program component can determine that the program learn has failed.

In still another aspect, the MP program component can employ a first program phase to facilitate programming received data to specified memory cells in the memory component. During the first program phase, the MP program component can set program pulse parameters, including respective gate voltages, source voltages, pulse widths, and drain voltage levels for respective programming subgroups, where the learned drain voltage levels can be utilized to facilitate setting respective initial drain voltage levels. For instance, the MP program component can set respective initial drain voltage levels for each subgroup (e.g. subgroup 21, subgroup 2x, subgroup 31, subgroup 3x, subgroup 41, subgroup 4x, where x can be a variable related to each of the data levels 2, 3, and 4) based at least in part on the learned drain voltages. For example, where each memory element has four levels available for programming, the drain voltage levels for subgroup 21 and subgroup 2x (e.g., representing data levels 22, 23, and 24) initially can be set to respective drain voltage levels based at least in part on the learned drain voltage for subgroup 21, where the drain voltage level for subgroup 21 can be set to a specified voltage level that is a specified amount lower than the learned drain voltage for subgroup 21 and the drain voltage level for subgroup 2x can be set to a specified voltage level that is a disparate specified amount lower than the learned drain voltage for subgroup 21 (e.g. the drain voltage level for subgroup 2x can be lower than the drain voltage level for subgroup 21); the drain voltage levels for subgroup 31 and subgroup 3x (e.g., representing data levels 32, 33, and 34) initially can be set to respective drain voltage levels based at least in part on the learned drain voltage for subgroup 31, where the drain voltage level for subgroup 31 can be set to a specified voltage level that is a specified amount lower than the learned drain voltage for subgroup 31 and the drain voltage level for subgroup 3x can be set to a specified voltage level that is a disparate specified amount lower than the learned drain voltage for subgroup 31 (e.g., the drain voltage level for subgroup 3x can be lower than the drain voltage level for subgroup 31); and the drain voltage levels for subgroup 41 and subgroup 4x (e.g., representing data levels 42, 43, and 44) initially can be set to respective drain voltage levels based at least in part on the learned drain voltage for subgroup 41, where the drain voltage level for subgroup 41 can be set to a specified voltage level that is a specified amount lower than the learned drain voltage for subgroup 41 and the drain voltage level for subgroup 4x can be set to a specified voltage level that is a disparate specified amount lower than the learned drain voltage for subgroup 41 (e.g., the drain voltage level for subgroup 4x can be lower than the drain voltage level for subgroup 41). Other program parameters, such as gate voltage, source voltage, and program pulse width can be set to respective predefined values for each subgroup. In an aspect, the program parameters, such as the drain voltage level, can be trimmable to facilitate setting the program parameters to desired levels or values.

Data to be programmed to the memory cells can be placed in respective subgroup buffer components based at least in part on the respective data states. For example, data to be programmed into memory elements of a memory cell as data states 21 (e.g., subgroup 21) can be stored in a subgroup 21 buffer component; data to be programmed into memory elements of a memory cell as data states 2x (e.g. subgroup 2x: subgroup 22, subgroup 23, or subgroup 24) can be stored in a subgroup 2x buffer component; data to be programmed into memory elements of a memory cell as data states 31 (e.g., subgroup 31) can be stored in a subgroup 31 buffer component; data to be programmed into memory elements of a memory cell as data states 3x (e.g., subgroup 32, subgroup 33, or subgroup 34) can be stored in a subgroup 3x buffer component; data to be programmed into memory elements of a memory cell as data states 41 (e.g., subgroup 41) can be stored in a subgroup 41 buffer component; and data to be programmed into memory elements of a memory cell as data states 4x (e.g., subgroup 42, subgroup 43, or subgroup 44) can be stored in a subgroup 4x buffer component.

For each of the subgroups, the MP program component can apply respective first program pulses to begin programming data to the memory cells (e.g., memory elements therein), where each first program pulse can have respective program parameter values based at least in part on the data state to which the particular memory cell is being programmed. The MP program component can perform a single read measurement to verify the program levels of the respective memory cells to determine whether any of the bits of data is programmed to the respective intrinsic verify voltage level for the particular subgroup. If any bits of data have been programmed to at least the respective intrinsic verify voltage level in accordance with a particular subgroup, the drain voltage level and gate voltage level for that particular subgroup can be recorded and stored. If there are any bits of data associated with a respective subgroup that have not been programmed to the desired intrinsic verify voltage level for a particular subgroup(s) (e.g. not verified), the drain voltage level for the particular subgroup(s) can be incremented by a predefined amount of voltage, and another program pulse can be applied to the memory cells associated with an unverified subgroup(s), where the next program pulse can be set to desired program parameters (e.g., incremented drain voltage). Any bits of data associated with a particular subgroup(s) that has been verified to a desired intrinsic verify voltage level does not receive a next program pulse. The MP program component can perform a single read to facilitate verifying the bits of data that received the next program pulse to determine whether any other subgroups are verified as being programmed to the desired intrinsic verify voltage level. The drain voltage level and gate voltage level for bits of data associated with a particular subgroup(s) that are verified can be recorded and stored. The first phase of programming can continue (e.g. incrementing the drain voltage level for any bits of data related to a subgroup that has not been verified, applying a next program pulse(s) with the new drain voltage level(s), and verifying the bits of data) until all bits of data for all subgroups are programmed to respective intrinsic verify voltage levels associated with respective subgroups. When memory cells associated with all the subgroups are verified to respective intrinsic verify voltage levels, the first phase of programming can be complete.

After completing the first phase of programming, the MP program component can apply a second phase of programming to complete the programming of data to the desired memory cells (e.g., memory elements therein) in the memory component. For each of the subgroups, the MP program component can set respective program parameters, where the initial gate voltage can be set at the gate voltage stored at the completion of the first phase of programming and the initial drain voltage for each subgroup can be set at a drain voltage level stored for a particular subgroup at the end of the first phase of programming, and the source voltage and pulse width can be set to predefined values. The MP program component can apply respective first program pulses to memory cells respectively associated with the subgroups to continue programming data to the memory cells. The MP program component can perform a single read measurement to verify the program levels of the respective memory cells to determine whether any of the bits of data is programmed to at least the respective desired final verify voltage level for the particular subgroup. If any bits of data have been programmed to at least the respective final verify voltage level in accordance with a particular subgroup, the programming of the data with respect to that particular subgroup(s) can be complete. If there is any bits of data associated with a subgroup(s) that have not been programmed to the desired final verify voltage level for a particular subgroup(s) (e.g., not verified), the gate voltage level for the particular subgroup(s) can be incremented by a predefined amount of voltage, and another program pulse can be applied to those bits of data, where the next program pulse can be set to desired program parameters (e.g., incremented gate voltage). Any bits of data associated with a particular subgroup(s) that has been verified to a desired final verify voltage level does not receive a next program pulse. The MP program component can perform a single read to facilitate verifying the bits of data that received the next program pulse to determine whether any bits of data of a subgroup(s) are verified as being programmed to at least the desired final verify voltage level. The second phase of programming can continue (e.g., incrementing the gate voltage level for any bits of data related to a subgroup that has not been verified, applying a next program pulse(s) using the new gate voltage level(s), and verifying the bits of data of a subgroup(s)) until all bits of data for all subgroups are programmed to respective final verify voltage levels associated with respective subgroups or until a maximum gate voltage is reached. If the maximum gate voltage is reached and there are memory cells of a subgroup(s) that are not verified to the final verify voltage level, the MP program component can adjust the respective gate voltage for a subgroup down to a specified voltage level, and the MP program component can perform one or more iterations to apply a respective program pulse(s) to memory cells of the subgroup(s) that are not verified to facilitate programming the memory cells so they reach the final verify voltage level, where the respective gate voltages can be adjusted (e.g., increased) by a predefined amount between program pulses, up to the maximum gate voltage. If there are memory cells of a subgroup(s) that are not verified to the final verify voltage level after the maximum gate voltage is again reached, the MP program component can determine that there is a program fail and can provide an indication that there is a program fail. When all bits of data have been programmed to the desired final verify voltage level for respective subgroups (or if there is a program fail), the programming of data can be complete.

In accordance with still another aspect, methods that can employ multi-phase programming to facilitate efficiently programming data into memory cells of a memory component are presented. In yet another aspect, an electronic device that can comprise a memory component that can employ multi-phase programming to facilitate efficiently programming data into memory cells of a memory component are presented.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
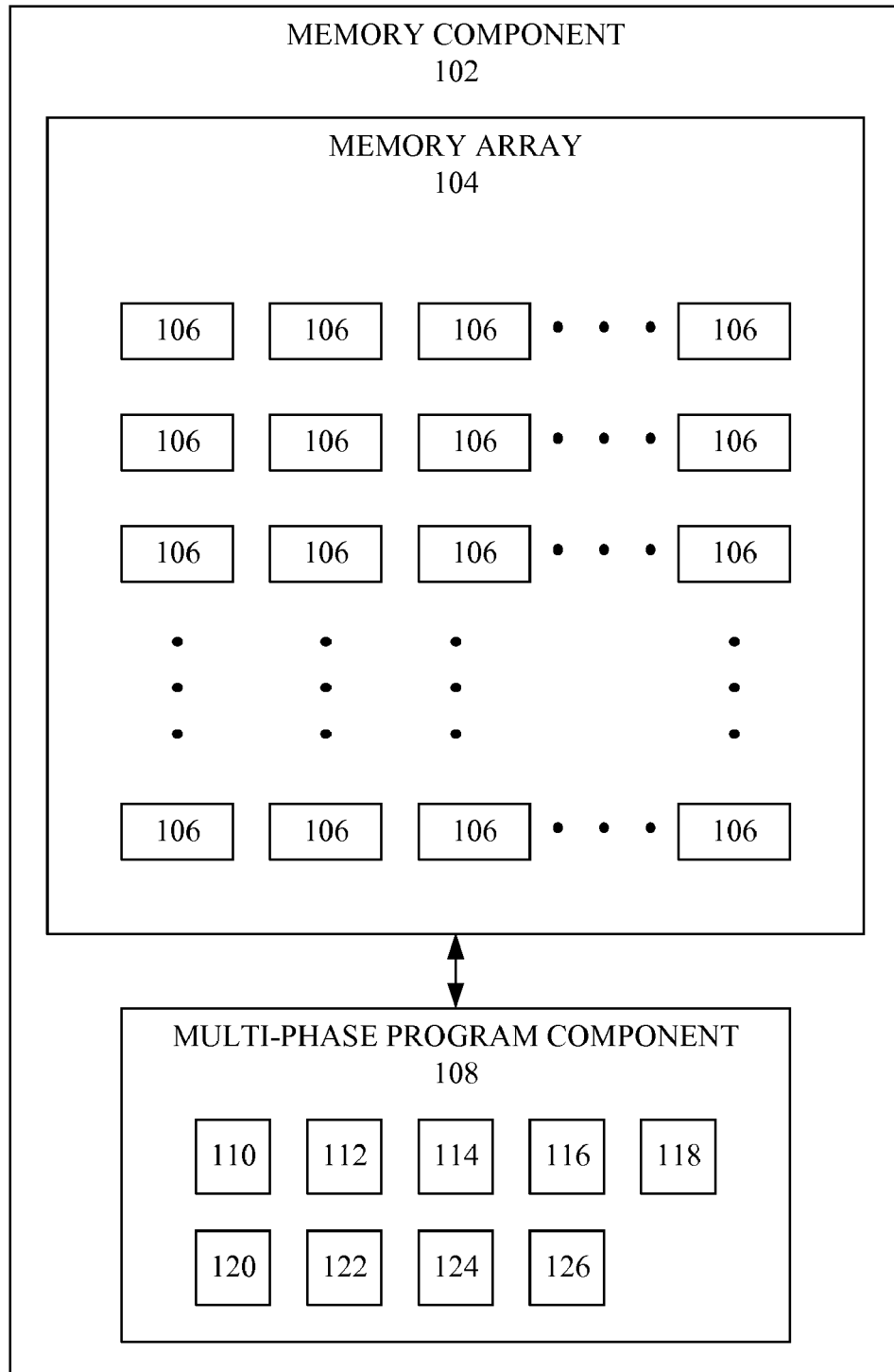
FIG. 1 illustrates a block diagram of a system that can employ multi-phase programming to facilitate programming data in a memory component in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, as a memory, such as multi-level flash memory, is subject to erase cycles and/or other use that can cause wear to the memory, the read margins for each level can become smaller (e.g., the windows for each level can become smaller), which can result in data retention loss and/or read errors with regard to stored data. To facilitate improved programming of multi-level memory cells and reduction of data retention loss with regard to the memory cells, it is desirable to employ programming techniques that can result in very tight threshold voltage distribution widths for each data level of a multi-level memory cell.

Systems, devices, and methods are presented that can employ multi-phase programming to facilitate efficiently programming data to non-volatile memory (e.g., multi-level flash memory). In an aspect, a memory component can comprise a multi-phase (MP) program component that can employ multi-phase programming to program data to memory cells in the non-volatile memory in a specified program pattern that arranges data being programmed so that the difference in data states (e.g., data levels) between adjacent memory elements (e.g., memory elements within a memory cell; a memory element of a first memory cell adjacent to a memory element of a neighboring memory cell) is optimized (e.g., minimized). The multi-phase programming can facilitate programming data in a very tight distribution (e.g. tighter distribution than conventional memory devices), which can facilitate reducing data retention loss as compared to conventional memory devices. Programming data using the specified program pattern can facilitate reducing disturb between adjacent memory elements in the memory component, and can provide improved performance over conventional memory devices.

The MP program component can perform a program learn over a subset of memory cells (e.g. memory element(s) within a memory cell) by applying one or more program pulses to the subset of memory cells, where a drain voltage level can be incremented after each pulse, until a respective intrinsic verify voltage level is reached for each programming level (e.g. data level 2 related to subgroup 21, data level 3 related to subgroup 31, and data level 4 related to subgroup 41, where level 1 is an unprogrammed state) to facilitate determining desired drain voltage levels with respect to each subgroup. The MP program component can utilize the learned drain voltage levels for each programming level (and associated subgroups) to facilitate determining respective initial drain voltage levels to be applied to each subgroup of memory cells during a first phase of programming, where there can be respective drain voltage levels applied depending on a particular subgroup (e.g., subgroup 21, subgroup 2x, subgroup 31, subgroup 3x, subgroup 41, subgroup 4x) for each memory cell being programmed during the programming operation. During the first phase, one or more respective program pulses can be applied to the memory cells to begin programming the memory cells to the desired data state in accordance with the program pattern, where the first phase of programming can be completed when the memory cells are programmed to respective intrinsic verify voltage levels associated with the data state and related subgroup. During the first phase, the respective drain voltages associated with unverified subgroups can be incremented after each program pulse, where another program pulse can be applied to those memory cells associated with a subgroup(s) that has not been verified to the corresponding intrinsic verify voltage level for that subgroup(s). The first phase of programming can be complete when all subgroups are verified to respective intrinsic verify voltage levels, where the respective drain voltage levels and gate voltage levels for each subgroup when verified can be recorded and utilized as part of the second phase of programming. During the second phase of programming, the respective drain voltage levels and gate voltage levels for each subgroup from the end of the first phase can be utilized as initial program parameter values. The drain voltage levels can remain fixed during the second phase, and the respective gate voltage levels can be incremented between program pulses to facilitate programming each memory cell to respective final verify voltage levels respectively associated with the subgroups (associated with specified data states) in accordance with the predefined program pattern. One or more program pulses can be applied to the memory cells respectively associated with the subgroups until each subgroup is verified to a corresponding final verify voltage level to complete the programming process.

FIG. 1 illustrates a system 100 that can facilitate refresh of data associated with a memory component in accordance with an aspect of the subject matter disclosed herein. System 100 can include a memory component 102 that can be comprised of a memory array(s) 104 that can store data, operation code, commands, etc., in individual memory cells 106 in the memory array 104. For instance, in a memory array 104, there can be R memory cells 106, where R can be a desired integer number. Each memory cell 106 can comprise one or more memory elements, where each memory element can store one or more bits of data (e.g., multi-level, multi-bit memory cell). In yet another aspect, the memory component 102 can comprise non-volatile memory (e.g., flash memory) and/or volatile memory (e.g., static random access memory (SRAM)), where the memory array(s) 104 can be non-volatile memory. It is to be appreciated and understood that, while one memory component 102 is depicted in system 100, the subject innovation is not so limited, as system 100 can include a plurality of memory components 102. Only one memory component 102 is depicted herein for brevity and clarity.

Memory component 102 can also include a multi-phase (MP) program component 108 that can be associated with the memory array 104, and can employ multi-phase programming to facilitate programming data to desired memory cells 106 in the memory array 104. When data is being programmed to specified memory cells 106, the data can be scrambled and arranged in a predefined program pattern such that the difference between data levels between adjacent bits of data can be reduced or minimized to facilitate reducing bit disturb between adjacent memory elements (e.g., memory elements within the same memory cell 106, or a memory element in a memory cell 106 that is adjacent to a memory element in a neighboring memory cell 106). In an aspect, the incoming data, which is to be programmed, can be stored in a buffer component 110, which can comprise volatile memory (e.g. static random access memory (SRAM)), for example, during the multi-phase programming process.

Figure 2:
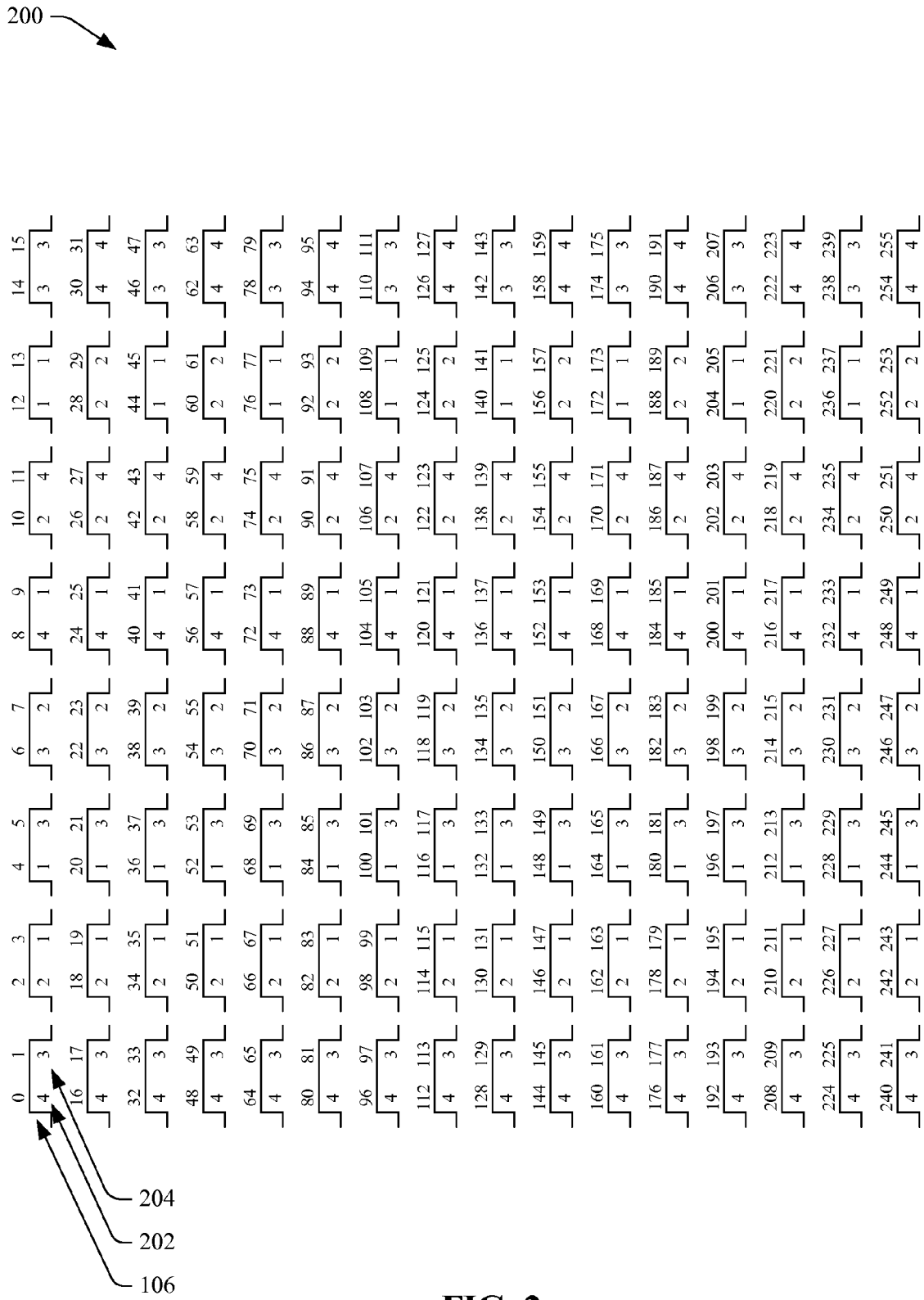
FIG. 2 illustrates an example program pattern in accordance with an embodiment of the disclosed subject matter.

Referring briefly to FIG. 2, illustrated is an example program pattern 200 in accordance with an embodiment of the disclosed subject matter. The program pattern 200 can relate to one wordline associated with 128 memory cells 106 in memory array 104. The program pattern 200 can be a repetitive pattern with regard to a subset of memory cells 106 associated with a wordline and can be repeated for each wordline of the memory array 104. Each memory cell 106 can comprise two memory elements 202, 204. In this example, the program pattern 200 can comprise 256 memory elements corresponding to 256 bits (e.g., as number from 0 to 255 in program pattern 200 in FIG. 2), where each bit can have a specified data level (e.g., corresponding to a specified data state). In one aspect, the program pattern 200 can be arranged such that the difference in data levels between memory elements within a memory cell 106 and a memory element of a memory cell 106 and an adjacent memory element of a neighboring memory cell 106 can be optimized (e.g. minimized) to facilitate reducing bit disturb between adjacent memory elements as well as bit disturb between adjacent wordlines. The program pattern 200 is also arranged to include each subgroup, subgroups 21, 22, 23, and 24, subgroups 31, 32, 33, and 34, subgroups 41, 42, 43, and 44, and subgroups 11, 22, 33, and 44, where a subgroup can represent the respective data levels of memory elements (e.g., 202, 204) within a particular memory cell 106. Further, the program pattern 200 can be arranged so that the subgroups are arranged in a repetitive pattern, for example, as depicted in FIG. 2, and the memory cells 106 of each wordline in the memory array 104 can be programmed in accordance with the program pattern 200 when being programmed. It can be observed that, in the program pattern 200, the "solid" subgroups, 11, 22, 33, and 44, are alternated, which is designed in this manner for this embodiment, because otherwise it would have taken 20 memory cells to account for the 16 available states, and it is desired that the pattern repetition span over 16 memory cells for this embodiment. It is to be appreciated and understood that, in accordance with various other embodiments, the subject innovation can employ different program patterns that meet predefined program pattern criteria, as disclosed herein.

For instance, in accordance with the predefined program pattern criteria, the program pattern 200 can be arranged to minimize or reduce instances where a memory element with data level 1 (e.g., unprogrammed data state) is adjacent to a memory element programmed to data level 4 (e.g., the highest programmed data state in a 4-level memory element), and/or to maximize or increase instances where a memory element with a particular data level is adjacent to a memory element having a data level that is the same level, one level higher, or one level lower than the particular data level, as opposed to more than one level higher or lower, to facilitate reducing bit disturb (e.g., memory element with data level 3 adjacent to a memory element with data level 2).

It is to be appreciated and understood that the program pattern 200 is one example of a program pattern that can be employed to facilitate reducing bit disturb, and the subject innovation is not so limited to this one example, as, in accordance with the subject innovation, other types of program patterns can be employed to reduce instances where a memory element with data level 1 is adjacent to a memory element with data level 4, and/or to increase instances where a memory element with a particular data level is adjacent to a memory element having a data level that is the same level, one level higher, or one level lower than the particular data level, as opposed to more than one level higher or lower. For example, program pattern 200 can be adjusted so that instead of bit 12 having data level 1 being adjacent to bit 11 having data level 4, bits 12 and 13 can be switched with bits 14 and 15, so that bit 12 can have data level 3, which can be next to bit 11 with data level 4.

Figure 3:
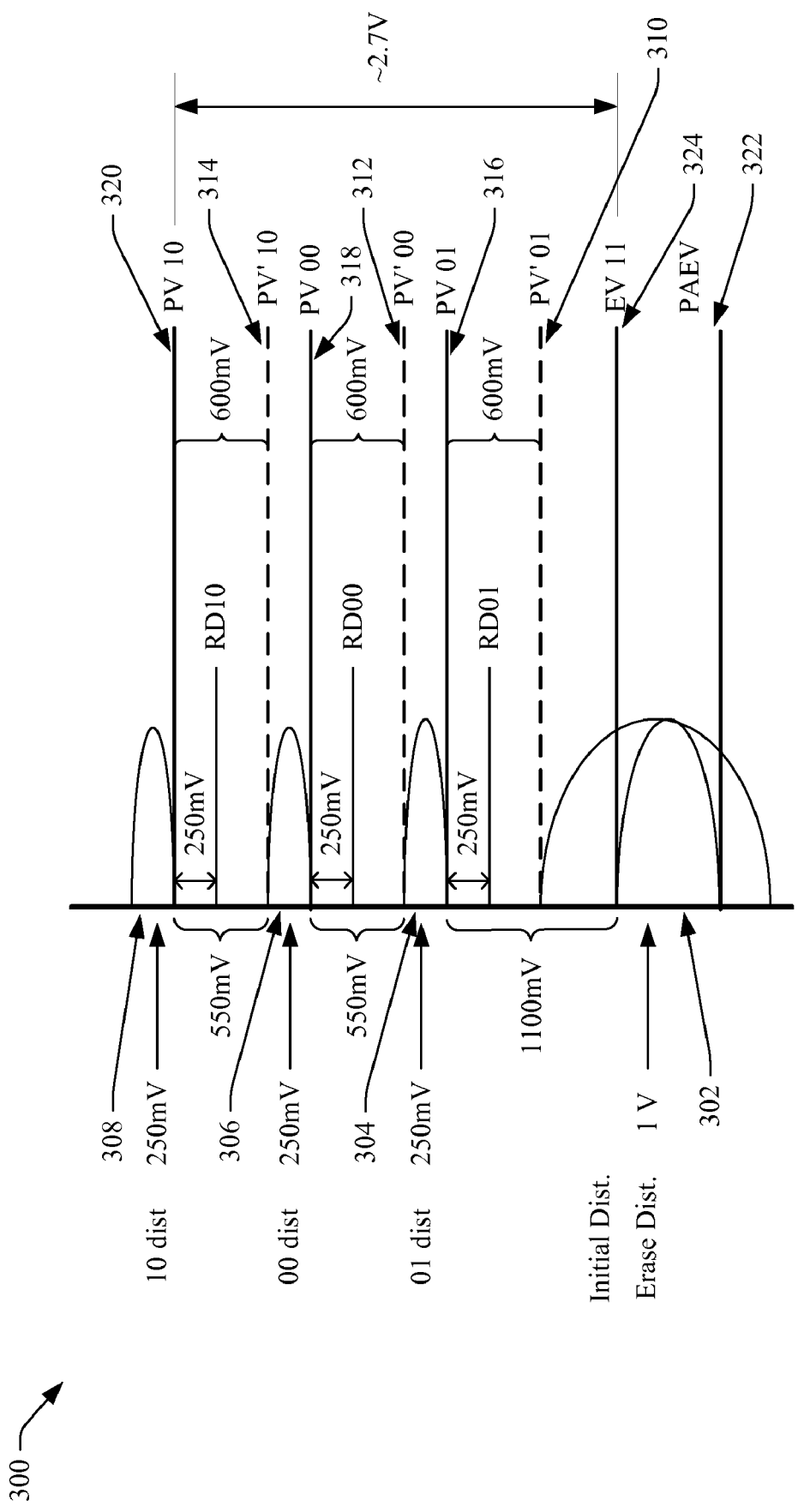
FIG. 3 depicts an example window of operation related to a memory cell in accordance with an embodiment of the disclosed subject matter.

Referring to FIG. 3, illustrated is an example window of operation 300 related to a memory cell in accordance with an embodiment of the disclosed subject matter. The window of operation 300 relates to a multi-bit memory cell 106 of a memory component 102. In this embodiment, the memory cell 106 can comprise four data states, an unprogrammed level (e.g., data level 1 (11)), a first program level (e.g., data level 2 (01)), a second program level (e.g. data level 3 (00)), and a third program level (e.g., data level 4 (10)). In the window of operation 300, there can be an erase distribution 302, which can span 1 volt, for example. The distribution associated with the first program level can have a width of 250 millivolts (mv) (304), the second program level can have a width of 250 mv (306), and the third program level can have a width of 250 mv (308), with a separation of 550 mv between each program level and 1100 mv between the first program level and the erase level. The window of operation 300 also includes intrinsic verify voltage levels for each program level, PV' 01 (310), PV' 00 (312), PV' 10 (314), which can be target levels employed during the program learn and first phase of programming, and final verify voltage levels, PV 01 (316), PV 00 (318), PV 10 (320), which can be target levels employed during the second phase of programming. The verify level after erase can be represented by PAEV (322) in the window of operation 300. The erase verify level can be represented by EV 11 (324).

Referring again to FIG. 1, in accordance with an aspect of the disclosed subject matter, the program component 108 can perform a program learn to facilitate determining desired drain voltage levels for each programming level (e.g., level 2, level 3, level 4) that can be employed during the first phase of programming. In an aspect, the program component 108 can set program parameters, such as the initial gate voltage (e.g. 9.5 v), initial drain voltage for each data level (e.g., 3.0 v for data level 2, 3.5 v for data level 3, 4.0 v for data level 4), source voltage (e.g., 0.0 v), pulse width (e.g., 300 ns), a predefined maximum number of pulses (e.g. 10 pulses), a predefined increment value (e.g., 0.1 v), and a test program pattern (e.g., all 0s) to be applied to a subset of memory cells 106 during the program learn. The subset of memory cells 106 can comprise, for example, the memory cells 106 that are associated with subgroup 21, subgroup 31 (e.g., depicted as bit 5=data level 3 and bit 4=data level 1 of program pattern 200), and subgroup 41, as found in the program pattern 200. The initial gate voltage can remain fixed throughout the program learn. The initial drain voltage level can be different for each data level (e.g., level 2 related to subgroup 21, level 3 related to subgroup 31, level 4 related to subgroup 41), and can be incremented (e.g., in 0.1 v increments), as desired, for each program pulse until the desired drain voltage levels are determined for each data level or until a learn fail has occurred.

In an aspect, the MP program component 108 can apply respective first program pulses having respective drain voltage levels to each of the memory cells 106 in the subset of memory cells 106 to program one word of data according to the test program pattern based at least in part on the respective drain voltage levels for each data level. After the respective program pulses have been applied, the MP program component 108 can evaluate (e.g., read or measure voltage level of) each memory cell 106 to which a program pulse has been applied to determine whether those memory cells 106 are verified for the respective intrinsic verify voltage levels (e.g. PV' 01, PV' 00, PV' 10). If all of these memory cells 106 are verified for their respective intrinsic verify voltage levels for each data level (e.g. associated with a corresponding subgroup—subgroup 21, subgroup 31, subgroup 41), the MP program component 108 can determine that the program learn is complete, and the MP program component 108 can record (e.g., store) the respective drain voltage levels for each data level, which can be utilized during the first phase of programming. If the MP program component 108 determines that a memory cell 106 associated with a respective data level is not verified to a corresponding intrinsic verify voltage level, the MP program component 108 can determine whether the predetermined maximum number of program pulses (e.g., or correspondingly, the maximum drain voltage level) has been reached.

If the MP program component 108 determines that the maximum number of program pulses have been applied, the MP program component 108 can indicate that a learn fail has occurred. If the MP program component 108 determines that the maximum number of program pulses has not been reached, the MP program component 108 can facilitate incrementing by a predefined amount of voltage (e.g., 0.1 v) the respective drain voltage level for each data level that is not verified. The MP program component 108 can apply a next program pulse to a memory cell(s) 106 associated with any data level that is not verified to program one word (e.g. using test program pattern of all 0s) to the memory cell(s) 106, where a program pulse can be based at least in part on a respective drain voltage level (as incremented) associated with a data level that is not verified. For any data level that has been verified, no program pulse is applied to a memory cell(s) 106 associated with a data level that is verified, and the drain voltage level, at the time the memory cell(s) 106 associated with the data level is verified, can be recorded (e.g., stored). The MP program component 108 can continue the program learn (e.g., applying a program pulse, verifying according to a relevant data level, and incrementing a drain voltage level for unverified data levels) until the desired drain voltage level for each data level (e.g., associated with each of subgroup 21, subgroup 31, and subgroup 41) is determined and recorded, or until a predetermined maximum number of program pulses (e.g., 10 program pulses) are applied without verifying the drain voltage levels for each data level (e.g., program learn failure). If the MP program component 108 verifies the respective drain voltage levels of each memory cell 106 to the respective intrinsic verify voltage level for each data level, the program component 108 can record the respective drain voltage levels for each data level (at the time the respective data level is verified), and the program learn can be complete.

In another aspect, the MP program component 108 can perform a first phase of programming, where the respective drain voltage levels learned during the program learn can be utilized to facilitate determining initial drain voltage levels with respect to each data level (and subgroup associated therewith). The MP program component 108 can set respective drain voltage levels for specified subgroups as a function of the learned drain voltage levels. For instance, with regard to three program levels (and four data levels overall, including the unprogrammed level), there can be six respective drain voltage levels that can be set, where the drain voltage level associated with subgroup 21 initially can be set to a specified voltage level that is a specified amount lower than the learned drain voltage for subgroup 21 associated with data level 2, and subgroup 2x (e.g., related to 22, 23, and 24) initially can be set to a specified voltage level that is a disparate specified amount lower than the learned drain voltage for subgroup 21 (e.g., the drain voltage level for subgroup 2x can be lower than the drain voltage level for subgroup 21); the drain voltage level associated with subgroup 31 initially can be set to a specified voltage level that is a specified amount lower than the learned drain voltage for subgroup 31 associated with data level 3, and subgroup 3x (e.g. related to 32, 33, and 34) initially can be set to a specified voltage level that is a disparate specified amount lower than the learned drain voltage for subgroup 31 (e.g., the drain voltage level for subgroup 3x can be lower than the drain voltage level for subgroup 31); and the drain voltage level associated with subgroup 41 initially can be set to a specified voltage level that is a specified amount lower than the learned drain voltage for subgroup 41 associated with data level 4, and subgroup 4x (e.g., related to 42, 43, and 44) initially can be set to a specified voltage level that is a disparate specified amount lower than the learned drain voltage for subgroup 41 (e.g., the drain voltage level for subgroup 4x can be lower than the drain voltage level for subgroup 41). Other program parameters, such as gate voltage, source voltage, and pulse width also can be set to respective predefined values. In accordance with an aspect, the program parameters, such as the drain voltage level, can be trimmable to facilitate setting or adjusting the program parameters to desired levels or values during programming.

The MP program component 108 can run a blank threshold voltage (Vt) bitmap per bit and store the Vt bitmap in an old Vt array 112. The MP program component 108 can load and store data, as scrambled and re-arranged in accordance with the program pattern 200, in respective subgroup buffer components, including subgroup 21 buffer component 114, subgroup 2x buffer component 116, subgroup 31 buffer component 118, subgroup 3x buffer component 120, subgroup 41 buffer component 122, subgroup 4x buffer component 124. For example, in the subgroup 21 buffer component 114, bits that are 21 can be set to 0 and all other bits (e.g., bits for 22, 23, 24, 31, 32, 33, 34, 41, 42, 43, 44) can be set to 1, where, during programming, the bits set to 0 will receive the program pulse(s) associated with subgroup 21, and the bits set to 1 will not receive the program pulse(s) associated with subgroup 21; in the subgroup 2x buffer component 116, bits that are 2x (e.g., 22, 23, 24) can be set to 0 and all other bits (e.g. bits for 21, 31, 32, 33, 34, 41, 42, 43, 44) can be set to 1, where, during programming, the bits set to 0 will receive the program pulse(s) associated with subgroup 2x, and the bits set to 1 will not receive the program pulse(s) associated with subgroup 2x. The other subgroup buffer components, subgroup 31 buffer component 118, subgroup 3x buffer component 120, subgroup 41 buffer component 122, subgroup 4x buffer component 124, can have data loaded and stored therein in a similar and corresponding fashion as described above with regard to subgroup 21 buffer component 114 and subgroup 2x buffer component 116.

Based at least in part on the respective program parameters, the MP program component 108 can apply first program pulses (e.g., a respective first program pulse for each subgroup based at least in part on the respective learned drain voltage levels) to selected memory cells 106 being programmed to respective data states to facilitate programming data to the respective selected memory cells 106 according to the respective data levels to which each memory element of the memory cells 106 is being programmed. The programming of the selected memory cells 106 can be based at least in part on the specified program pattern (e.g. program pattern 200) being employed during the program operation.

The MP program component 108 can evaluate the memory cells 106 to determine whether the memory cells 106 respectively associated with each subgroup (e.g., subgroup 21, subgroup 2x, subgroup 31, subgroup 3x, subgroup 41, subgroup 4x) is verified to a respective intrinsic verify voltage level respectively associated with each data level (e.g. PV' 01, PV' 00, PV' 10). In an aspect, after each program pulse is applied, the MP program component 108 can run a Vt bitmap per bit and can store the Vt bitmap in a new Vt array 126. The MP program component 108 also can record a delta Vt, which can be the difference between the new Vt memory array 126 and the old Vt array 112. The MP program component 108 can read the Vt distribution for all subgroups, for example, using the current level ($I_{ds}$) between the drain and source of the selected memory cells 106.

If the MP program component 108 determines that all of these memory cells 106 are verified for their respective intrinsic verify voltage levels for each data level (e.g., associated with a corresponding subgroup—subgroup 21, subgroup 2x, subgroup 31, subgroup 3x, subgroup 41, subgroup 4x), the MP program component 108 can determine that the first phase of programming is complete, and the MP program component 108 can record (e.g., store) the respective drain voltage levels and gate voltage levels, which can be utilized as initial drain voltage levels and gate voltage levels during the second phase of programming. The MP program component 108 can set the bits to 1 in all subgroup buffer components, the subgroups can be flagged as passed, and no additional program pulses will be applied for phase 1.

If the MP program component 108 determines that a memory cell(s) 106 associated with a respective subgroup is not verified to a corresponding verify voltage level, the MP program component 108 can facilitate incrementing by a predefined voltage level (e.g. 0.1 v) the respective drain voltage for each subgroup that is not verified. For any subgroup that is verified, the MP program component 108 can facilitate setting the bits in the subgroup buffer component associated therewith to 1 and flagging the associated subgroup(s) as passed, where all bits will then be set to 1, and no program pulse will be applied to the corresponding memory cells 106 during the next program pulse.

The MP program component 108 can apply a next program pulse to a memory cell(s) 106 associated with any subgroup that is not verified to program the memory cell(s) 106, where the next program pulse (e.g. respective next program pulses for each unverified subgroup) can be based at least in part on a respective drain voltage level (as incremented) associated with a subgroup that is not verified. The MP program component 108 can continue the first phase of programming (e.g., applying a program pulse, verifying according to a relevant data level or subgroup, and incrementing a drain voltage level for an unverified subgroup(s)) until the desired respective intrinsic verify voltage level for each of subgroup 21, subgroup 2x, subgroup 31, subgroup 3x, subgroup 41, and subgroup 4x) is verified. If the MP program component 108 verifies the respective intrinsic verify voltage levels of each memory cell 106 for each subgroup, the MP program component 108 can store the respective drain voltage levels and gate voltage levels for each subgroup that is verified, and the first phase of programming can be complete.

In yet another aspect, the MP program component 108 can perform a second phase of programming to program the memory cells 106 to desired final verify voltage levels based at least in part on the respective data states to which the memory cells 106 are being programmed. During the second phase of programming, the respective drain voltage levels for each subgroup can remain fixed and the gate voltage levels can be incremented, as desired, until the respective final verify voltage levels for each subgroup have been reached, or until it is determined that a program fail has occurred. The respective drain voltage levels and gate voltage levels for each subgroup recorded during the first phase of programming can be employed as initial drain voltage levels and gate voltage levels with respect to each subgroup for the second phase of programming. The MP program component 108 can set respective drain voltage levels and gate voltage levels for each subgroup according to the respective drain voltage levels and gate voltage levels for each subgroup. For instance, with regard to three program levels (and four data levels overall, including the unprogrammed level), there can be six respective drain voltage levels that can be set with respect to subgroup 21, subgroup 2x (e.g., related to 22, 23, and 24), subgroup 31, subgroup 3x (e.g., related to 32, 33, and 34), subgroup 41, and subgroup 4x (e.g., related to 42, 43, and 44). Other program parameters, such as source voltage and pulse width also can be set to predefined values.

The MP program component 108 also can run a blank Vt bitmap per bit and store the Vt bitmap in the old Vt memory array 112. The MP program component 108 can load and store data, as scrambled and re-arranged in accordance with the program pattern 200, in respective subgroup buffer components, subgroup 21 buffer component 114, subgroup 2x buffer component 116, subgroup 31 buffer component 118, subgroup 3x buffer component 120, subgroup 41 buffer component 122, and subgroup 4x buffer component 124. For example, in the subgroup 21 buffer component 114, bits that are 21 can be set to 0 and all other bits (e.g., bits for 22, 23, 24, 31, 32, 33, 34, 41, 42, 43, 44) can be set to 1, where, during programming, the bits set to 0 will receive the program pulse(s) associated with subgroup 21, and the bits set to 1 will not receive the program pulse(s) associated with subgroup 21. The other subgroup buffer components, subgroup 2x buffer component 116, subgroup 31 buffer component 118, subgroup 3x buffer component 120, subgroup 41 buffer component 122, subgroup 4x buffer component 124, can have data loaded and stored therein in a similar and corresponding fashion as described above with regard to subgroup 21 buffer component 114.

Based at least in part on the respective program parameters, the MP program component 108 can apply first program pulses (e.g., a respective first program pulse based at least in part on the respective drain voltage levels and gate voltage levels for each subgroup) to selected memory cells 106 being programmed to respective data states to facilitate programming data to the respective memory cells 106 according to the respective data levels to which each memory element of the memory cells 106 is being programmed. The programming of the memory cells 106 can be based at least in part on the specified program pattern (e.g. program pattern 200) being employed during the program operation.

After the respective first program pulses are applied, the MP program component 108 can evaluate the memory cells 106 to determine whether the memory cells 106 respectively associated with any subgroup (e.g. subgroup 21, subgroup 2x, subgroup 31, subgroup 3x, subgroup 41, subgroup 4x) are verified to a respective final verify voltage level respectively associated with each data level (e.g. PV 01, PV 00, PV 10). In an aspect, after each program pulse is applied, the MP program component 108 can run a Vt bitmap per bit and can store the Vt bitmap in a new Vt memory array 126. The MP program component 108 also can record a delta Vt, which can be the difference between the new Vt array 126 and the old Vt array 112. The MP program component 108 can read the Vt distribution for all subgroups, for example, using the current level ($I_{ds}$) between the drain and source of the selected memory cells 106.

If the MP program component 108 determines that all of these memory cells 106 are verified for their respective final verify voltage levels for each data level (e.g., associated with a corresponding subgroup—subgroup 21, subgroup 2x, subgroup 31, subgroup 3x, subgroup 41, subgroup 4x), the MP program component 108 can determine that the second phase of programming is complete. The MP program component 108 can set the bits to 1 in all subgroup buffer components, the subgroups can be flagged as passed, and no additional program pulses will be applied for phase 2.

When there is still at least one subgroup that is not verified, for any subgroup that is verified, the MP program component 108 can facilitate setting the bits in the subgroup buffer component associated therewith to 1 and flagging the associated subgroup(s) as passed, where all bits will then be set to 1, and no program pulse will be applied to the corresponding memory cells 106 during the next program pulse. For a memory cell(s) 106 associated with a respective subgroup that is not verified to a corresponding final verify voltage level by the MP program component 108, the MP program component 108 can facilitate incrementing by a predefined voltage level (e.g. 0.1 v) the respective gate voltage level for each subgroup that is not verified.

The MP program component 108 can apply a next program pulse to a memory cell(s) 106 associated with any subgroup that is not verified to program the memory cell(s) 106, where the next program pulse (e.g. respective next program pulses for each unverified subgroup) can be based at least in part on a respective gate voltage level (as incremented) and respective drain voltage level (as fixed) associated with a subgroup that is not verified. For any subgroup that has been verified, no program pulse is applied to a memory cell(s) 106 associated with the verified subgroup. The MP program component 108 can continue the second phase of programming (e.g., applying a program pulse, verifying according to a relevant data level or subgroup, and incrementing a respective source voltage level for an unverified subgroup(s)) until the memory cells 106 for each subgroup are verified to a final verify voltage level, or until a program fail is declared. If the MP program component 108 verifies the respective final verify voltage levels of each memory cell 106 for each subgroup, the second phase of programming can be complete.

In accordance with an aspect, during the second phase of programming, if the maximum gate voltage is reached and there are memory cells 106 of a subgroup(s) that are not verified to the final verify voltage level, the MP program component 108 determine whether the predetermined maximum gate voltage has been reached a predetermined number of times with regard to an unverified subgroup(s). If the predetermined maximum gate voltage has not been reached a predetermined number of times with regard to an unverified subgroup(s) during the second phase of programming, the MP program component 108 can increment a respective count related to the number of times the predetermined maximum gate voltage has been reached for a respective unverified subgroup(s). The MP program component 108 can adjust the respective gate voltage for a subgroup down to a specified voltage level (e.g., adjust gate voltage down by 200 mv, 400 mv, or 600 mv, . . . ), and the MP program component 108 can perform one or more iterations to apply a respective program pulse(s) to memory cells 106 of the subgroup(s) that are not verified to the respective final verify voltage level to facilitate programming the memory cells 106 so they reach the respective final verify voltage level. The respective gate voltages can be adjusted (e.g., increased) by a predefined amount (e.g., 100 mv), and other program parameters can be set, between program pulses for any subgroup that is not verified to the respective final verify voltage level, up to the maximum gate voltage. If there are memory cells 106 of a subgroup(s) that are not verified to the respective final verify voltage level(s) after the predetermined maximum gate voltage is reached the predetermined maximum number of times for the respective subgroup(s), the MP program component 108 can determine that there is a program fail and can provide an indication that there is a program fail.

Referring again to the memory component 102, the non-volatile memory can include, but is not limited to, flash memory (e.g., single-bit flash memory, multi-bit flash memory), read-only memory (ROM), mask-programmed ROM, programmable ROM (PROM), Erasable PROM (EPROM), Ultra Violet (UV)-erase EPROM, one-time programmable ROM, electrically erasable PROM (EEPROM), and/or nonvolatile RAM (e.g., ferroelectric RAM (FeRAM)). A flash memory can be comprised of NAND memory and/or NOR memory, for example. Volatile memory can include, but is not limited to, random access memory (RAM), SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

It is to be appreciated and understood that, while the disclosed subject matter in some embodiments and aspects refers to a memory cell having two memory elements where each memory element can be in one of four available data levels, the subject innovation is not so limited, and the multi-phase programming can be performed on other types of memory cells in accordance with the disclosed subject matter.

Figure 4:
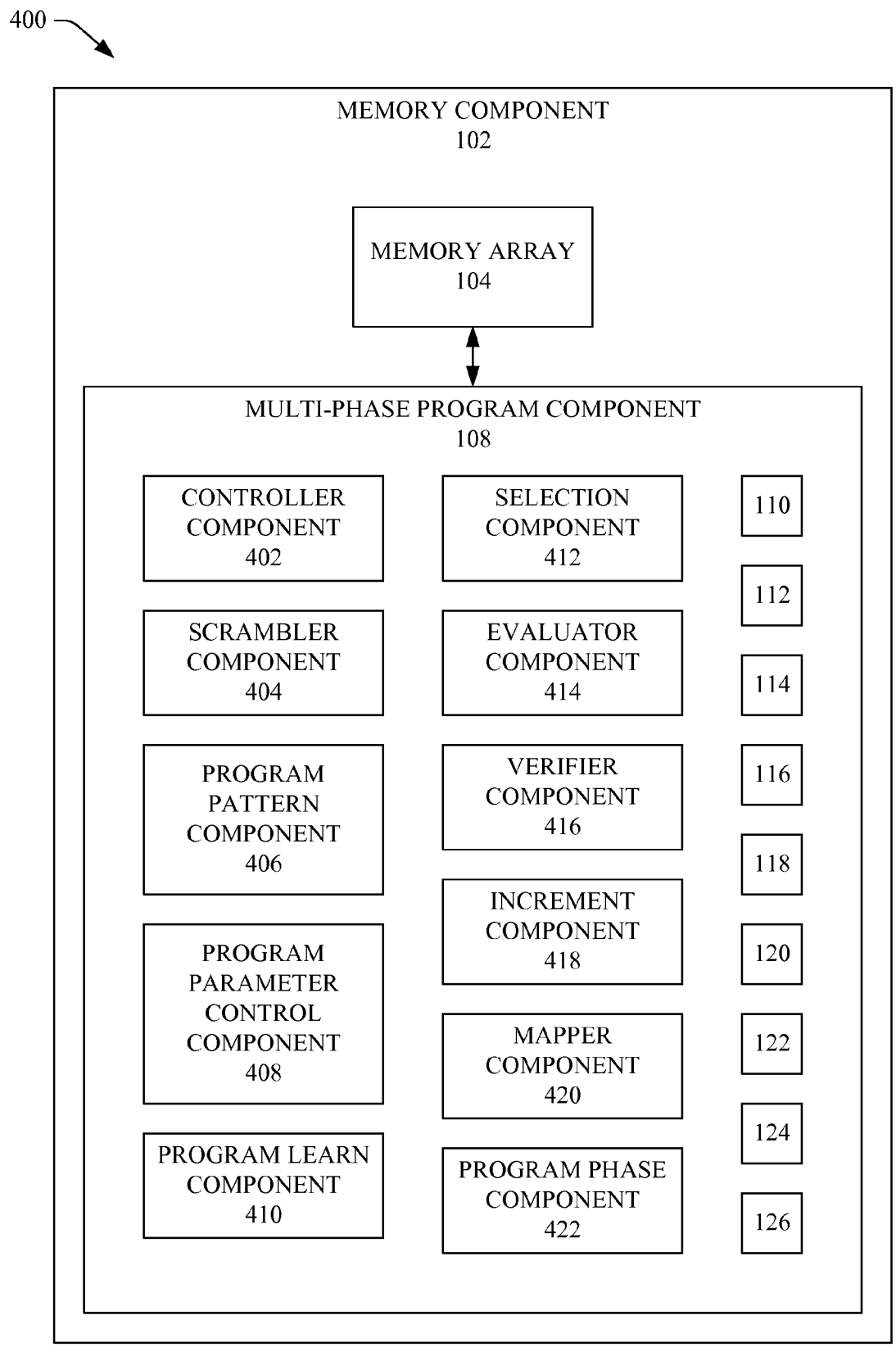
FIG. 4 illustrates a block diagram of a system that can employ multi-phase programming of data in a memory in accordance with an aspect of the disclosed subject matter.

FIG. 4 illustrates a block diagram of a system 400 that can employ multi-phase programming of data in a memory in accordance with an aspect of the disclosed subject matter. System 400 can comprise a memory component 102 that can be utilized to store data. The memory component 102 can include a memory array 104 that can contain a plurality of memory cells 106 (not shown in FIG. 3, where each memory cell 106 can comprise one or more memory elements that each can store one or more bits of data. The memory component 102 can further contain a MP program component 108 that can employ multi-phase programming to facilitate efficiently programming data in the memory component 102. The memory component 102 also can comprise a buffer component 110 that can be utilized to stored incoming data to be programmed to memory cells 106 in the memory array 104. The memory component 102 also can comprise a subgroup 21 buffer component 114, subgroup 2x buffer component 116, subgroup 31 buffer component 118, subgroup 3x buffer component 120, subgroup 41 buffer component 122, and subgroup 4x buffer component 124, which can be utilized to store respective subsets of data during multi-phase programming to facilitate programming of data. The memory component 102 also can include an old Vt array 112 and a new Vt array 126 that can be utilized to facilitate reading the Vt distribution related to all subgroups. It is to be appreciated and understood that the memory component 102, memory array 104, memory cells 106, MP program component 108, buffer component 110, old Vt array 112, subgroup 21 buffer component 114, subgroup 2x buffer component 116, subgroup 31 buffer component 118, subgroup 3x buffer component 120, subgroup 41 buffer component 122, and subgroup 4x buffer component 124, and new Vt array 126, each can be the same or similar as, and/or can comprise the same or similar respective functionality as, respective components, such as more fully described herein, for example, with regard to system 100.

In accordance with an aspect, the MP program component 108 can include a controller component 402 that can facilitate control of the flow of data to and from the memory component 102. In an aspect, the controller component 402 can facilitate execution of operations (e.g., read, write, verify, erase) associated with memory cells 106 in the memory array 104 based at least in part on received commands. In another aspect, the controller component 402 can operate in conjunction with other components, including those components associated with the MP program component 108 to facilitate performing functions and operations associated with the memory component 102.

In another aspect, the MP program component 108 can include a scrambler component 404 that can facilitate scrambling incoming data being written to the memory component 102 to re-arrange the incoming data so that the data is arranged in a desired predefined program pattern to facilitate reducing bit disturb. In an aspect, the MP program component 108 also can employ a program pattern component 406 that can generate a desired predefined program pattern that can be utilized in conjunction with the scrambler component 404 to facilitate re-arranging incoming data in accordance with the predefined program pattern (e.g., program pattern 200). For example, the program pattern component 406 can employ a program pattern to facilitate re-arranging incoming data to minimize or reduce instances where a memory element with data level 1 (e.g., unprogrammed data state) is adjacent to a memory element programmed to data level 4 (e.g., the highest programmed data state in a 4-level memory element), and/or to maximize or increase instances where a memory element with a particular data level is adjacent to a memory element having a data level that is the same level, one level higher, or one level lower than the particular data level, as opposed to more than one level higher or lower, to facilitate reducing bit disturb (e.g., memory element with data level 3 adjacent to a memory element with data level 2.

In yet another aspect, the MP program component 108 can employ a program parameter control component 408 that can facilitate setting and/or adjusting program parameters, including respective gate voltages, drain voltages, source voltages, pulse widths, maximum number of program pulses, drain voltage and/or gate voltage increment values, and/or other program parameters associated with multi-phase programming in the memory component 102 based at least in part on the operation (e.g., program learn, first phase of programming, second phase of programming, . . . ) being performed and the data values being programmed.

The MP program component 108 also can contain a program learn component 410 that can facilitate performing a program learn to determine desired drain voltage levels respectively associated with data level 2, data level 3, and data level 4, where the desired drain voltage levels can be utilized to facilitate determining respective initial drain voltage levels for each subgroup of memory cells 106 during the first phase of programming. The desired drain voltage levels can be the respective drain voltage levels respectively utilized and measured when intrinsic verify voltage levels respectively associated with the data levels are reached.

In another aspect, the MP program component 108 can include a selection component 412 that can facilitate selecting memory cells 106 that are to receive a particular program pulse based at least in part on the subgroup with which a particular memory cell 106 is associated and whether the subgroup is verified as having passed for a respective verify voltage level (e.g., intrinsic verify voltage level, final verify voltage level) related to the particular operation (e.g., program learn, first phase of programming, second phase of programming) being performed. For example, the selection component 412 can facilitate selecting memory cells 106 associated with a subgroup(s) based at least in part on the information contained in the subgroup buffer components.

The MP program component 108 also can contain an evaluator component 414 that can measure and evaluate the voltage levels associated with memory cells 106 (associated with respective subgroups) that have received a program pulse to facilitate determining whether a particular subgroup is verified. The evaluator component 414 can operate in conjunction with a verifier component 416 that can compare measured voltage levels from memory cells 106 related to respective subgroups to desired corresponding pre-verify voltage levels (e.g., intrinsic verify voltage levels, final verify voltage levels) to facilitate determining whether a subgroup(s) is verified to pass with regard to the operation being performed.

The MP program component 108 can further employ an increment component 418 that can facilitate incrementing a drain voltage level by a predefined amount of voltage during a program learn or first phase of programming when the verifier component 416 determines that at least one subgroup is not verified, and when it is determined that the maximum number of program pulses has not been reached. The increment component 418 also can facilitate incrementing a gate voltage level by a predefined amount of voltage during the second phase of programming when the verifier component 416 determines that at least one subgroup is not verified.

The MP program component 108 also can employ a mapper component 420 that can facilitate running and generating Vt bitmaps per bit and storing the Vt bitmaps in a desired array, such as an old Vt array 112 or a new Vt array 126. The mapper component 420 also can facilitate determining and recording a delta Vt, which can be the difference between the new Vt array and the old Vt array. Employing the new Vt array, old Vt array, and delta Vt array, the mapper component 420 and selection component 412 can facilitate determining which subgroup(s) (and memory cells 106 associated therewith) is to receive another program pulse.

In still another aspect, the MP program component 108 can comprise a program phase component 422 that can facilitate selecting a particular phase of programming, and can facilitate controlling program parameter settings and operations associated with the first phase and second phase of programming.

It is to be appreciated and understood that the buffer component 110, old Vt array 112, subgroup 21 buffer component 114, subgroup 2x buffer component 116, subgroup 31 buffer component 118, subgroup 3x buffer component 120, subgroup 41 buffer component 122, and subgroup 4x buffer component 124, new Vt array 126, controller component 402, scrambler component 404, program pattern component 406, program parameter component 408, program learn component 410, selection component 412, evaluator component 414, verifier component 416, increment component 418, mapper component 420, and program phase component 422, each can be a stand-alone unit (e.g., controller component 402 can be a stand-alone unit, as desired), can be included within the MP program component 108 (as depicted), can be incorporated within another component, and/or virtually any suitable combination thereof, as desired.

Figure 5:
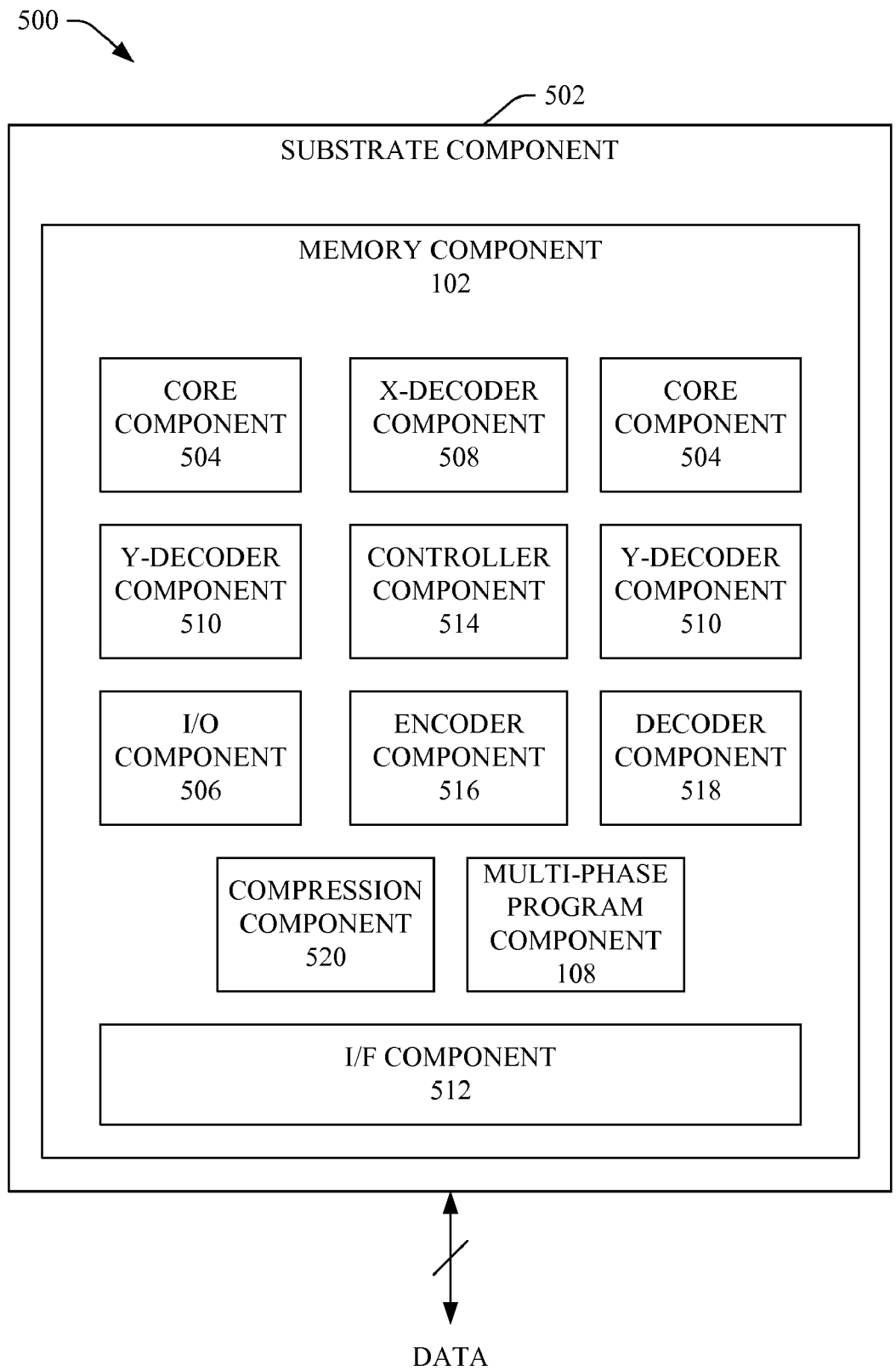
FIG. 5 depicts a block diagram of a memory device that can employ multi-phase programming to facilitate efficient program of data in the memory device in accordance with an aspect of the disclosed subject matter.

Turning to FIG. 5, depicted is a block diagram of a memory device 500 that can employ multi-phase programming to facilitate efficient program of data in the memory device in accordance with an aspect of the disclosed subject matter. Memory device 500 can comprise a memory component 102 that can comprise a non-volatile memory (e.g., flash memory) and/or volatile memory (e.g., SRAM). The memory component 102 can receive information, including data, commands, and/or other information, which the memory component 102 can process (e.g., store data, execute commands, etc.). The memory component 102 can include a memory array(s) 104 (e.g., as illustrated in FIG. 1 and described herein) that can comprise a plurality of memory cells (e.g., 106) (not shown in FIG. 4) in which data can be stored. The memory component 102 can also comprise a MP program component 108 that can utilize multi-phase programming to facilitate efficiently programming data in the memory array 104 of the memory component 102. It is to be appreciated and understood that the memory component 102, memory array 104, memory cells 106, MP program component 108, each can be the same or similar as, and/or can comprise the same or similar respective functionality as, respective components, such as more fully described herein, for example, with regard to system 100 and system 400.

In one aspect, the memory component 102, including the memory array 104 (not shown in FIG. 5) and MP program component 108, and other components described herein, for example, with regard to memory device 500 can be formed and/or contained on a substrate component 502 (e.g., semiconductor substrate). In another aspect, one or more core components 504 (e.g., high-density core regions) and one or more lower-density peripheral regions can be formed on the substrate 502. The core component(s) 504 typically can include one or more M by N arrays (e.g., memory array 104) of individually addressable, substantially identical multi-bit memory cells (e.g., 106) (not shown in FIG. 4).

The lower-density peripheral regions can typically include an input/output component 506 (e.g., input/output (I/O) circuitry) and programming circuitry for selectively addressing the individual memory cells. The programming circuitry can be represented in part by and can include one or more x-decoder components 508 and one or more y-decoder components 510 that can cooperate with the I/O component 506 for selectively connecting a source (not shown), gate (not shown), and/or drain (not shown) of selected addressed memory cells to predetermined voltages or impedances to effect designated operations (e.g. programming, reading, verifying, erasing) on the respective memory cells, and deriving necessary voltages to effect such operations. For example, an x-decoder component 508 and a y-decoder component 510 can each receive address bus information, which can be provided as part of a command, and such information can be utilized to facilitate determining the desired memory cell(s) in the memory component 102.

Figure 7:
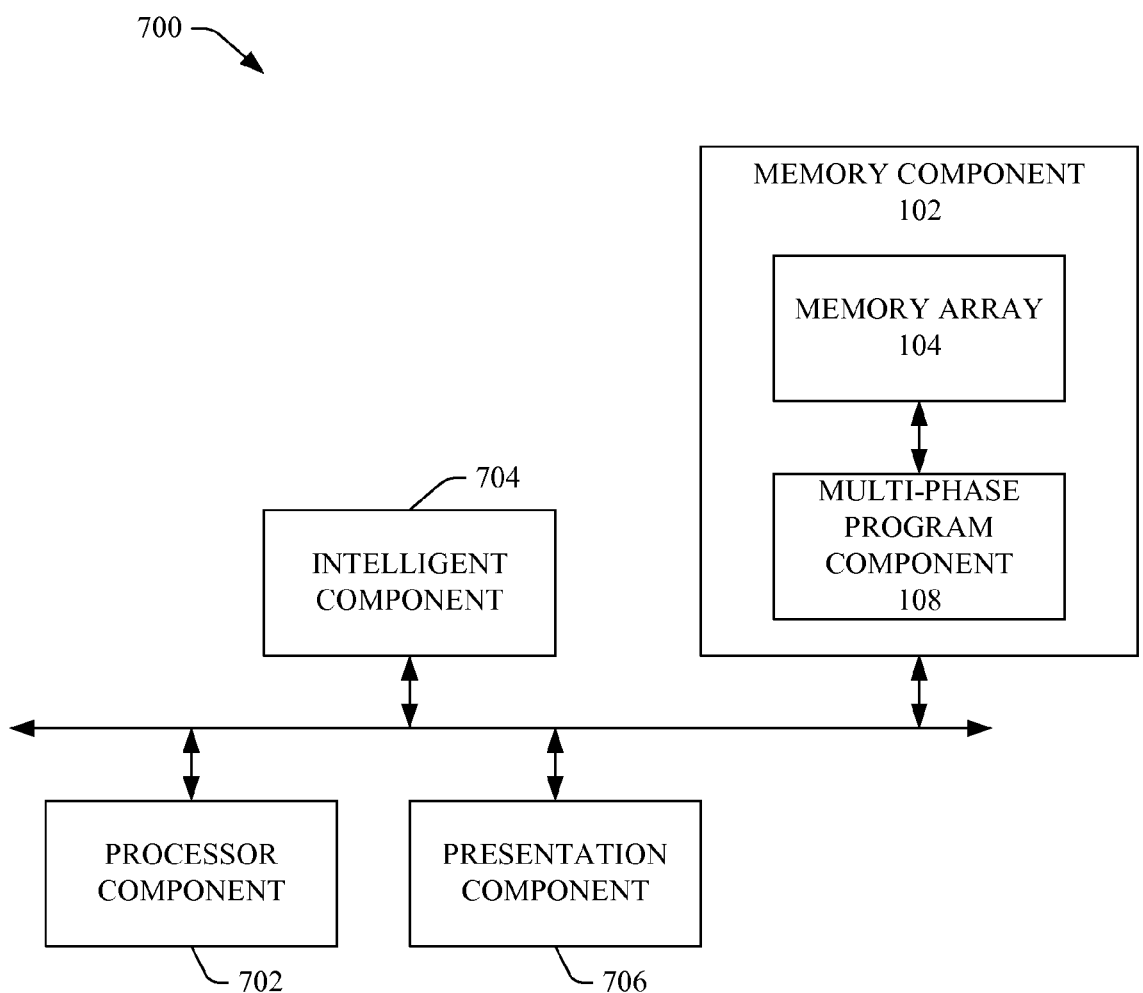
FIG. 7 depicts a block diagram of a system that can employ intelligence to facilitate multi-phase programming of data in a memory component in accordance with an embodiment of the disclosed subject matter.

The memory component 102 can receive information (e.g., data, commands, etc.) via an interface component 512 (also referred to herein as "I/F 412"), which can also be formed on substrate 502. I/F 512 can include and/or provide various adapters, connectors, channels, communication paths, etc. to integrate the memory component 102 into virtually any operating and/or database system(s) and/or with another system(s). In addition, I/F 512 can provide various adapters, connectors, channels, communication paths, etc., that can provide for interaction and/or communication with a processor component (e.g., as depicted in FIG. 7 and described herein), and/or any other component, data, and the like, associated with the memory device 500.

In another aspect, the memory device can include a controller component 514 that can be formed on substrate 502. The controller component 514 can facilitate control of the flow of data to and from the memory component 102. In an aspect, the controller component 514 can facilitate execution of operations (e.g., read, write, verify, erase) associated with memory cells 106 in the memory array 104 based at least in part on received commands.

The memory component 102 can also contain an encoder component 516 that can facilitate encoding data being programmed to the memory component 102, where the encoder component 516 also can be formed on the substrate 502. For example, the encoder component 516 can facilitate converting a digital signal to an analog signal (e.g., current level) to facilitate programming data in the storage locations (e.g., memory cells) in the memory component 102.

The memory component 102 can further include a decoder component 518 that can facilitate decoding data being read from the memory component 102. The decoder component 518 can receive an analog signal associated with data, where the analog signal can be stored in the storage location in the memory array 104, and can facilitate converting the analog signal to a digital signal, so that such digital signal representing the read data can be provided to another component (e.g., processor component) for further processing.

Memory component 102 can further include a compression component 520 that can be formed on substrate 502 and can be used to facilitate the compression and decompression of data and/or code to be stored in the memory array 104, to facilitate reducing and/or minimizing the consumption of the available memory in the memory array 104. For example, in response to a request by a host processor (e.g., processor component 702, as illustrated in FIG. 7 and described herein) to read data (e.g., MP3 file) from the memory component 102, the requested data can be retrieved from the memory array 104, with the compression component 520 being used to facilitate de-compression of the data being read from the memory array 104. The de-compressed data can be provided by the memory component 102 to the host processor. In another aspect, the compression component 520 can be used to compress data being received from a host processor for storage in the memory array 104, with the compression component 520 compressing the data before storing the data in a specified location in the memory array 104. Common forms of data compression include algorithms based upon the Lempel-Ziv (LZ) compression method including LZ-Welch, LZ-Renau, and Huffman. Data compression techniques can be "lossy" or "lossless", where "lossy" compression can involve the loss of information between the source code and the compressed code and can be an acceptable effect in such applications as image and sound files, and "lossless" compression schemes can be reversible, allowing the original data to be fully reconstructed. Choice between the use of "lossy" vs. "lossless" compression can depend in part upon the application and file type to be compressed.

In one aspect, memory device 500 can also include a bus (not shown) that can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Figure 6:
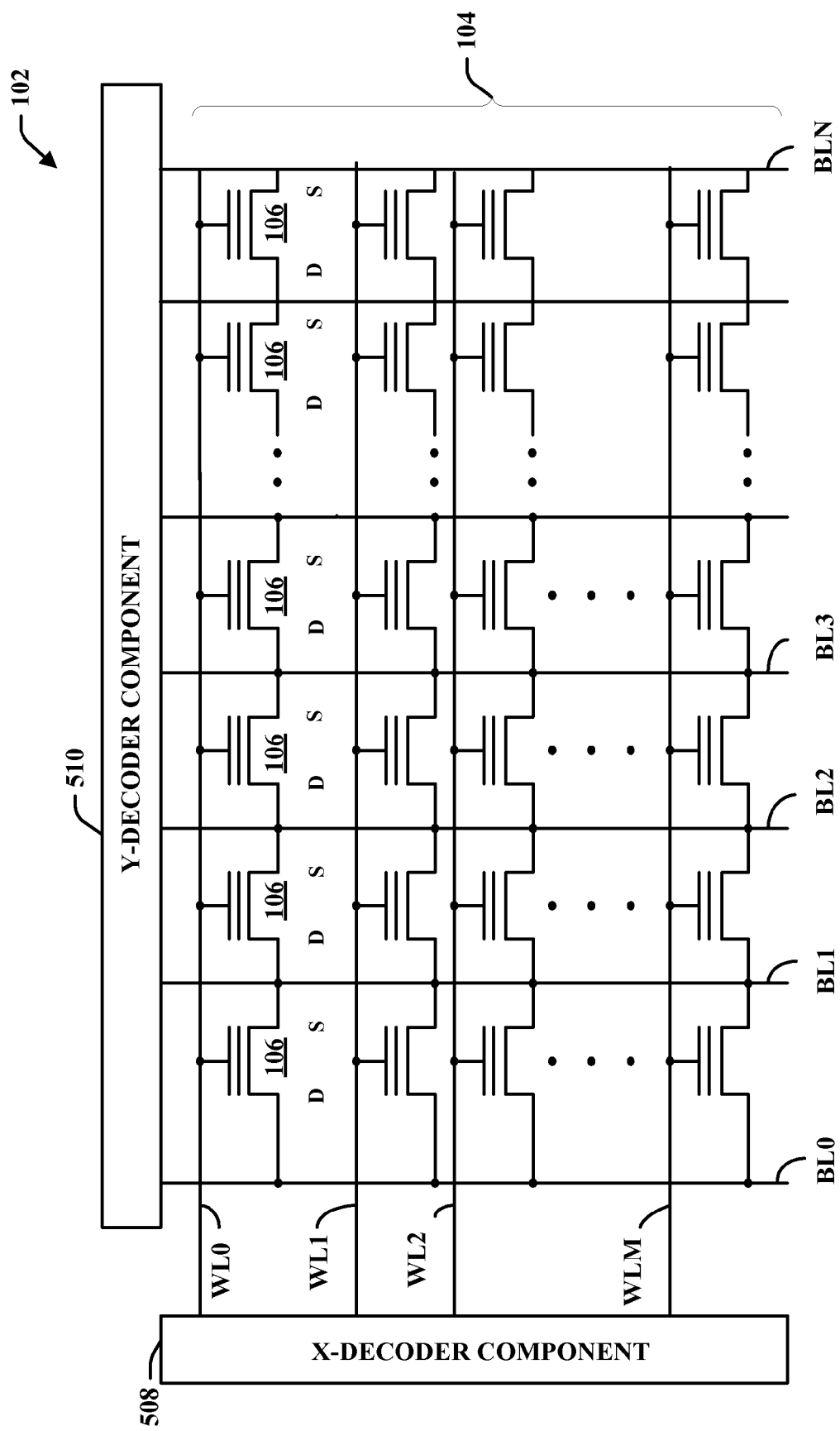
FIG. 6 illustrates an example diagram of a memory array that can be employed in a memory component in accordance with the disclosed subject matter.

FIG. 6 illustrates an example diagram of a portion of a memory component 102 in accordance with an aspect of the disclosed subject matter. The portion of the memory component 102 can comprise a memory array 104 that can include a plurality of memory cells 106 that each can be comprised of a drain, gate, and source. It is to be understood that, as desired, the drain also can act as a source, and the source can act as a drain, depending in part on the operation being performed on the memory cell 106. Each memory cell 106 can have one or more data levels (e.g., 4 data levels) therein and can thereby store one or more bits of data therein. In another aspect, each memory cell 106 can comprise multiple memory elements (e.g. memory element 202, memory element 204, as depicted in FIG. 2; not shown in FIG. 6) that each can be programmed to a respective data level. For example, in accordance with an embodiment, a memory cell 106 can comprise two memory elements that each can be set to one of four available data levels, thereby allowing the memory cell 106 to have sixteen available data states corresponding to four bits of data storage available. The memory array 104 can be associated with an X-decoder component 508 (e.g., WL decoder) and a Y-decoder component 510 (e.g., BL decoder) that can each respectively decode inputs/outputs during various operations (e.g., programming, reading, verifying, erasing) that can be performed on the memory cells 106. The X-decoder component 508 and Y-decoder component 510 can each receive address bus information from a host processor (e.g., as illustrated in FIG. 7) and/or system controller (not shown) or the like, and can utilize such information to facilitate accessing or selecting the desired memory cell(s) (e.g., memory location(s)) associated with the command. The memory cells 106 can be formed in M rows and N columns. A common WL can be attached to the gate of each memory cell 106 in a row, such as word-lines WL0, WL1, WL2, through WLM. A common BL can be attached to each cell 106 in a column, such as bit-lines BL0, BL1, through BLN. A WL can contain, for example, 1024 elements forming multiple words and a sector can include, for example, 512 WLs to provide at least 512 k elements of memory. In accordance with an aspect of the disclosed subject matter, respective voltages can be applied to one or more cells 106 through the WLs and BLs to facilitate performing operations, such as program, read, erase, and the like.

Referring to FIG. 7, depicted is a block diagram of a system 700 that can employ intelligence to facilitate multi-phase programming of data in a memory component in accordance with an embodiment of the disclosed subject matter. System 700 can include a memory component 102 that can be comprised of a non-volatile memory (e.g., multi-bit flash memory) and/or volatile memory (e.g. SRAM). The memory component 102 can include a memory array 104 that can be comprised of a plurality of memory cells 106 (not shown), where, for each memory cell 106, one or more bits of data can be stored (e.g., memory cell can comprise one or more memory elements, wherein each memory element can store one or more bits of data), and from which stored data can be read. The memory component 102 also can include a MP program component 108 that can employ multi-phase programming to facilitate efficiently programming data in the memory array 104. It is to be appreciated that the memory component 102, memory array 104, memory cells 106, and MP program component 108 each can be the same or similar as respective components, and/or can contain the same or similar functionality as respective components, as more fully described herein, for example, with regard to system 100, system 400, and memory device 500.

The system 700 can further include a processor component 702 that can be associated with the memory component 102 and other components via a bus. In accordance with an embodiment of the disclosed subject matter, the processor component 702 can be a typical applications processor that can manage communications and run applications. For example, the processor component 702 can be a processor that can be utilized by a computer, mobile handset, personal data assistant (PDA), or other electronic device. The processor component 702 can generate commands, including read, write, and/or erase commands, in order to facilitate reading data from, writing data to, and/or erasing data from the memory component 102.

The system 700 also can include an intelligent component 704 that can be associated with the memory component 102 and/or other components associated with system 700 to facilitate analyzing data, such as current and/or historical information related to multi-phase programming, and, based in part on such information, can make an inference(s) and/or a determination(s) regarding, for example, whether a voltage level of a memory element meets an intrinsic verify voltage level or final verify voltage level (as applicable), whether a particular verify voltage level is to be modified, whether a program learn has passed or failed, whether a phase (e.g., second phase) of programming has passed or failed, whether a program pattern is to be modified, whether an increment amount for the drain voltage during the program learn and/or first programming phase is to be adjusted, or whether an increment amount for the gate voltage during the second programming phase is to be adjusted, etc.

For instance, based in part on current and/or historical evidence related to multi-phase programming, the intelligent component 704 can infer that due to wear over the life of the memory component 102 or based at least in part on other criteria, a final verify voltage level should be modified to maintain desired performance. Based at least in part on the inference with respect to such data by the intelligent component 704, the MP program component 108 can facilitate modifying the particular final verify voltage level.

It is to be understood that the intelligent component 704 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naive Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 700 also can include a presentation component 706, which can be connected with the processor component 702. The presentation component 706 that provides various types of user interfaces to facilitate interaction between a user and any component coupled to the processor component 702. As depicted, the presentation component 706 is a separate entity that can be utilized with the processor component 702 and associated components. However, it is to be appreciated that the presentation component 706 and/or similar view components can be incorporated into the processor component 702 and/or a stand-alone unit. The presentation component 706 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the processor component 702.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

In accordance with one embodiment of the disclosed subject matter, the memory component 102, including the memory array 104, the MP program component 108, and/or other components, can be situated or implemented on a single integrated-circuit chip. In accordance with another embodiment, the memory component 102, including the memory array 104, the MP program component 108, and/or other components, can be implemented on an application-specific integrated-circuit (ASIC) chip. In yet another embodiment, the memory component 102 including the memory array 104, the MP program component 108, and/or other components, can be situated or implemented on multiple dies or chips.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIGS. 8-12 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 8:
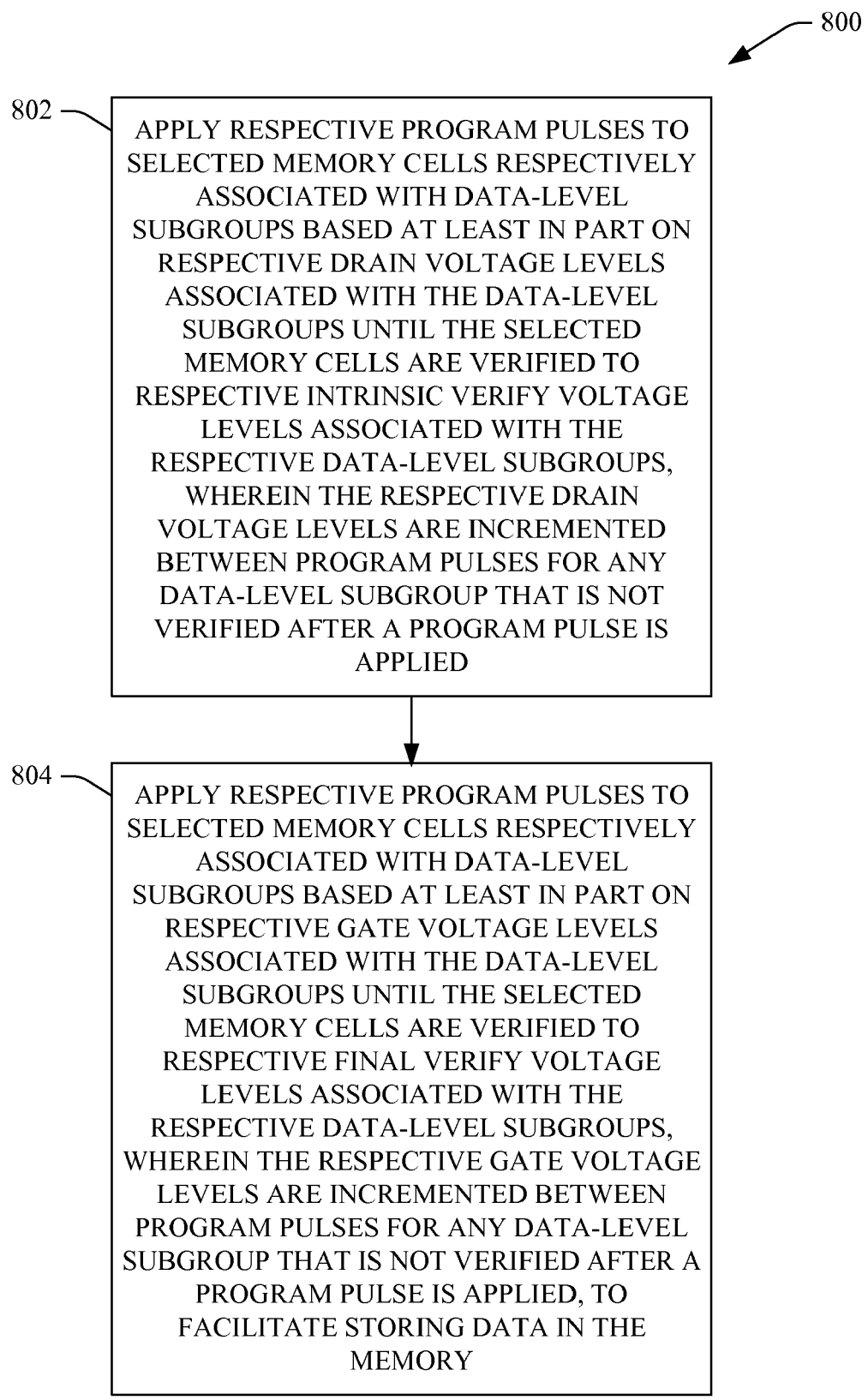
FIG. 8 illustrates a methodology that can employ multi-phase programming to facilitate efficiently programming data in a memory in accordance with an aspect of the disclosed subject matter is illustrated.

Referring to FIG. 8, a methodology 800 that can employ multi-phase programming to facilitate efficiently programming data in a memory in accordance with an aspect of the disclosed subject matter is illustrated. At 802, respective program pulses can be applied to selected memory cells 106 respectively associated with data-level subgroups based at least in part on respective drain voltage levels associated with the data-level subgroups until the selected memory cells 106 are verified to respective intrinsic verify voltage levels associated with the data-level subgroups, wherein the respective drain voltage levels are incremented between program pulses for any data-level subgroup that is not verified to a respective intrinsic verify voltage levels after a program pulse is applied.

At 804, respective program pulses can be applied to selected memory cells 106 respectively associated with data-level subgroups based at least in part on respective gate voltage levels associated with the data-level subgroups until the selected memory cells 106 are verified to respective final verify voltage levels associated with the respective data-level subgroups, wherein the respective gate voltage levels are incremented between program pulses for any data-level subgroup that is not verified after a program pulse is applied, to facilitate storing data in the memory. At this point, methodology 800 can end.

Figure 9:
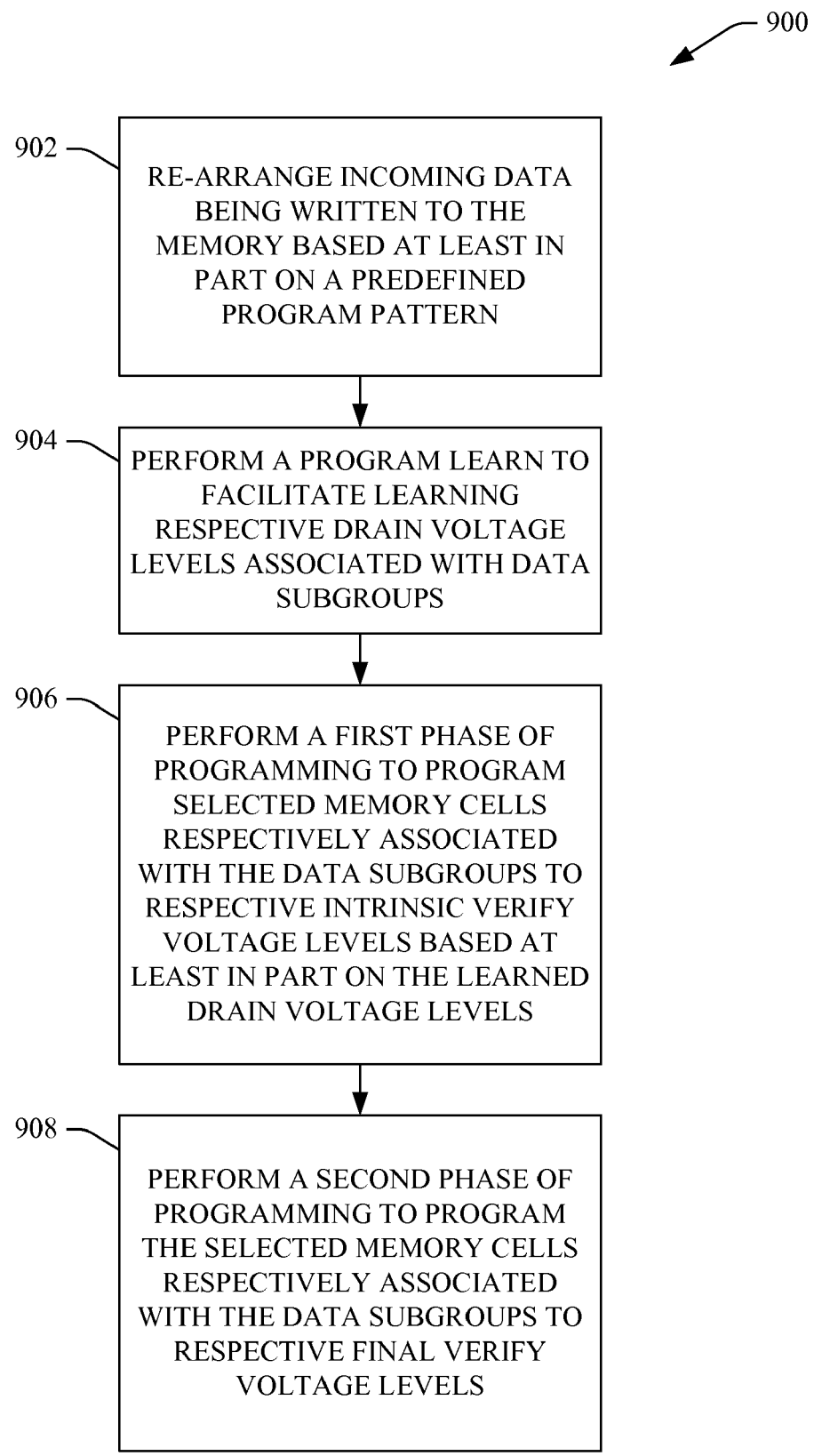
FIG. 9 depicts another methodology that can employ multi-phase programming to facilitate efficiently programming data in a memory in accordance with an aspect of the disclosed subject matter.

Turning to FIG. 9, illustrated is another methodology 900 that can employ multi-phase programming to facilitate efficiently programming data in a memory in accordance with an aspect of the disclosed subject matter. At 902, incoming data being written to the memory can be re-arranged based at least in part on a predefined program pattern (e.g., program pattern 200). In an aspect, incoming data can be scrambled and re-arranged based at least in part on the program pattern 200 to minimize or reduce instances where a memory element with data level 1 (e.g., unprogrammed data state) is adjacent to a memory element programmed to data level 4 (e.g. the highest programmed data state in a 4-level memory element), and/or to maximize or increase instances where a memory element with a particular data level is adjacent to a memory element having a data level that is the same level, one level higher, or one level lower than the particular data level, as opposed to more than one level higher or lower, to facilitate reducing bit disturb (e.g., memory element with data level 3 adjacent to a memory element with data level 2) in the memory (e.g. memory component 102). The data, as re-arranged, can be stored in a buffer component 110.

At 904, a program learn can be performed to facilitate learning drain voltage levels respectively associated with the data subgroups. In an aspect, program parameters, such as an initial gate voltage, initial drain voltage, a source voltage, a pulse width, and a test program pattern can be set to respective predefined values to facilitate determining respective drain voltage levels for desired program levels (e.g., data level 2 associated with subgroup 21, data level 3 associated with subgroup 31, data level 4 associated with subgroup 41) that can be employed during the first programming phase. Respective first program pulses can be applied to a subset of memory cells 106 respectively associated with each subgroup. After the first program pulse is applied, the subset of memory cells 106 can be measured (e.g. read) and evaluated to determine whether any subgroup is verified according to its corresponding data level and intrinsic verify voltage level (e.g., memory cell(s) 106 associated with a subgroup is charged at least up to the corresponding intrinsic verify voltage level). If all of the subgroups are verified as a pass to respective intrinsic verify voltage levels, the program learn can be complete. If a subgroup(s) is not verified, the drain voltage level associated with that subgroup(s) can be incremented by a predefined amount of voltage and another program pulse can be applied to the memory cell(s) 106 associated with the unverified subgroup(s). The subgroup(s) can be evaluated again to determine whether the subgroup(s) is verified. The program learn process can continue until all subgroups are verified, or until a predetermined number of program pulses have been applied without successful program learn, where a program learn fail can be declared. If all subgroups are verified, the respective drain voltage levels for each subgroup can be recorded, where the drain voltage levels can be utilized to facilitate setting initial drain voltages for respective subgroups of memory cells 106 during the first programming phase.

At 906, a first phase of programming can be performed to program selected memory cells respectively associated with the data subgroups to respective intrinsic verify voltage levels associated with the data subgroups based at least in part on the learned drain voltage levels. During the first programming phase, drain voltage levels applied during program pulses can be adjusted (e.g., incremented), as desired, until the subgroups are verified as meeting respective intrinsic pre-verify voltage levels. In an aspect, for the first programming phase, respective program parameters, such as initial drain voltage level, initial gate voltage level, source voltage level, pulse width can be set to desired values for each subgroup: subgroup 21, subgroup 2x, subgroup 31, subgroup 3x, subgroup 41, subgroup 4x. The drain voltage level for subgroup 21 initially can be set to a specified voltage level that is a specified amount lower than the learned drain voltage for subgroup 21 associated with data level 2, and subgroup 2x (e.g., related to 22, 23, and 24) initially can be set to a specified voltage level that is a disparate specified amount lower than the learned drain voltage for subgroup 21 (e.g., the drain voltage level for subgroup 2x can be lower than the drain voltage level for subgroup 21); the drain voltage for subgroup 31 initially can be set to a specified voltage level that is a specified amount lower than the learned drain voltage for subgroup 31 associated with data level 3, and subgroup 3x (e.g., related to 32, 33, and 34) initially can be set to a specified voltage level that is a disparate specified amount lower than the learned drain voltage for subgroup 31 (e.g., the drain voltage level for subgroup 3x can be lower than the drain voltage level for subgroup 31); and the learned drain voltage for subgroup 41 initially can be set to a specified voltage level that is a specified amount lower than the learned drain voltage for subgroup 41 associated with data level 4, and subgroup 4x (e.g., related to 42, 43, and 44) initially can be set to a specified voltage level that is a disparate specified amount lower than the learned drain voltage for subgroup 41 (e.g. the drain voltage level for subgroup 4x can be lower than the drain voltage level for subgroup 41). Thus, there can be six separate drain voltages employed respectively for the six subgroups of memory cells 106. Respective first program pulses, based at least in part on the respective program parameters, can be applied to memory cells 106 respectively associated with the subgroups to begin programming data to the memory component 102.

The MP program component 108 can evaluate the memory cells 106 after the first program pulses are applied to determine whether the respective charge levels meet a respective intrinsic verify voltage level related to a respective subgroup. If all subgroups are verified as passing respective intrinsic verified voltage levels, the respective drain voltage levels and gate voltage levels for each subgroup can be recorded, and the first phase of programming can be complete. If it is determined that a subgroup(s) is not verified, the drain voltage level associated with that subgroup(s) can be incremented by a predefined amount of voltage and another program pulse can be applied to the memory cell(s) 106 associated with the unverified subgroup(s). The next program pulse is not applied to any subgroup that is verified as passed. The subgroup(s) can be evaluated again to determine whether the subgroup(s) is verified. The first phase programming process can continue until all subgroups are verified to respective intrinsic verify levels. When all subgroups are verified, the respective drain voltage levels and gate voltage levels for each subgroup can be recorded, where the drain voltage levels and gate voltage levels can be utilized during the second programming phase.

At 908, a second phase of programming can be performed to program the selected memory cells respectively associated with the data subgroups to respective final verify voltage levels associated with the data subgroups. During the second programming phase, gate voltage levels applied during program pulses can be adjusted (e.g., incremented), as desired, until the subgroups are verified as meeting respective final verify voltage levels. In an aspect, for the second programming phase, respective program parameters, such as initial drain voltage level, initial gate voltage level, source voltage level, pulse width can be set to desired values for each subgroup: subgroup 21, subgroup 2x, subgroup 31, subgroup 3x, subgroup 41, subgroup 4x. The drain voltage level and gate voltage level for subgroup 21 from the first programming phase can be utilized as the initial drain voltage level for subgroup 21; the drain voltage level and gate voltage level for subgroup 2x from the first programming phase can be utilized as the initial drain voltage level for subgroup 2x; the drain voltage level and gate voltage level for subgroup 31 from the first programming phase can be utilized as the initial drain voltage level for subgroup 31; the drain voltage level and gate voltage level for subgroup 3x from the first programming phase can be utilized as the initial drain voltage level for subgroup 3x; the drain voltage level and gate voltage level for subgroup 41 from the first programming phase can be utilized as the initial drain voltage level for subgroup 41; and the drain voltage level and gate voltage level for subgroup 4x from the first programming phase can be utilized as the initial drain voltage level for subgroup 4x. Respective first program pulses, based at least in part on the respective program parameters, can be applied to memory cells 106 respectively associated with the subgroups to continue programming data to the memory component 102.

The MP program component 108 can evaluate the memory cells 106 after the first program pulses are applied to determine whether the respective charge levels meet respective final verify voltage levels related to respective subgroups. If all subgroups are verified as passing respective verify voltage levels, the second phase of programming can be complete and the programming can end. If it is determined that a subgroup(s) is not verified, the gate voltage level associated with that subgroup(s) can be incremented by a predefined amount of voltage, up to a predetermined maximum gate voltage, and another program pulse can be applied to the memory cell(s) 106 associated with the unverified subgroup(s). The next program pulse is not applied to any subgroup that is verified as passed. The subgroup(s) can be evaluated again to determine whether the subgroup(s) is verified. The second phase programming process can continue until all subgroups are verified to respective final verify levels, or until a program fail is declared. When all subgroups are verified, the second programming phase can be complete, and programming can end.

In an aspect, during the second phase of programming, if the predetermined maximum gate voltage is reached and there are memory cells 106 of a subgroup(s) that are not verified as a pass to the final verify voltage level, the respective gate voltage for a subgroup(s) can be adjusted down to a specified voltage level (e.g., adjust gate voltage down by 200 mv, 400 mv, or 600 mv, . . . ), and one or more iterations can be performed to apply a respective program pulse(s) to memory cells 106 of the subgroup(s) that are not verified as a pass to the final verify voltage level to facilitate programming the memory cells 106 of the subgroup(s) so they are verified as a pass to the final verify voltage level. Between program pulses, the respective gate voltages can be adjusted (e.g., increased) by a predefined amount (e.g., 100 mv), up to the predetermined maximum gate voltage, and other program parameters can be set, for any subgroup that is not verified to the final verify voltage level. If there are memory cells 106 of a subgroup(s) that are not verified to the final verify voltage level after the maximum gate voltage is again reached, the MP program component 108 can determine that there is a program fail and can provide an indication that there is a program fail.

Figure 10:
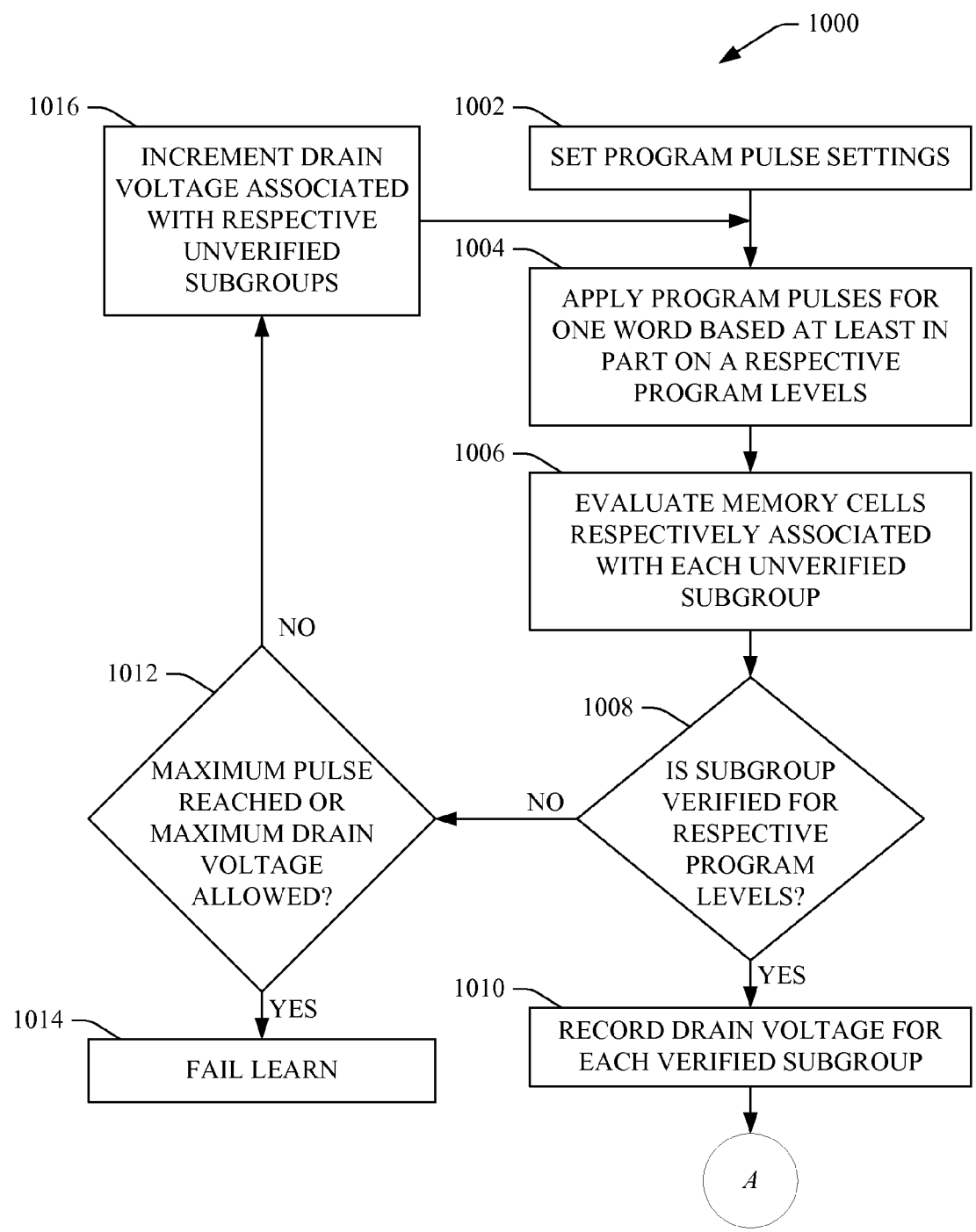
FIG. 10 illustrates a methodology that can perform a program learn to facilitate multi-phase programming of data in a memory in accordance with an aspect of the disclosed subject matter.

Referring to FIG. 10, illustrated is a methodology 1000 that can perform a program learn to facilitate multi-phase programming of data in a memory in accordance with an aspect of the disclosed subject matter. At 1002, program parameters related to multi-phase programming can be set. In an aspect, program parameters, such as an initial gate voltage, initial drain voltage, a source voltage, a pulse width, and a test program pattern can be set to respective predefined values to facilitate determining respective drain voltage levels for specified program levels (e.g., data level 2 associated with subgroup 21, data level 3 associated with subgroup 31, data level 4 associated with subgroup 41). The learned drain voltage levels for each subgroup can be employed to facilitate setting initial drain voltages for respective subgroups of memory cells to be programmed during the first programming phase.

At 1004, respective first program pulses can be applied to a subset of memory cells 106 respectively associated with each subgroup to program one word based at least in part on the test program pattern to the subset of memory cells 106. The first program pulses can be based at least in part on respective program parameters related to each subgroup.

At 1006, the memory cells 106 for each subgroup can be evaluated to facilitate determining whether a subgroup(s) is verified. In an aspect, the MP program component 108 can measure (e.g., read) and evaluate the memory cells 106 associated with each subgroup to facilitate determining whether one or more subgroups are verified as meeting respective intrinsic verify voltage levels.

At 1008, a determination can be made regarding whether any subgroup is verified according to its corresponding intrinsic verify voltage level (e.g., memory cell(s) 106 associated with a subgroup is charged at least up to the intrinsic verify voltage level). If all or a portion of the subgroups are verified, at 1010, respective drain voltage levels for each subgroup that is verified as a pass to the intrinsic verify voltage level can be recorded. At this point, if all of the subgroups are verified as a pass to the intrinsic verify voltage level, the program learn can be complete, and methodology 1000 can proceed to reference point A.

If, at 1008, it is determined that one or more subgroups is not verified, at 1012, a determination can be made as to whether a maximum number of program pulses has been reached. In an aspect, the program learn can employ a predetermined maximum number of program pulses, where the predetermined maximum number of program pulses can correlate to a maximum drain voltage to be applied during the program learn. If, at 1012, it is determined that the predetermined maximum number of program pulses has been applied, at 1014, the program learn can be deemed a fail. If, at 1012, it is determined that the predetermined maximum number of program pulses has not been reached, at 1016, a drain voltage level(s) respectively associated with a subgroup(s) that is not verified can be incremented. In an aspect, a respective drain voltage level(s) can be incremented by a predetermined amount of voltage. At this point, the methodology 1000 can return to reference numeral 1004, and methodology 1000 can proceed from that point. When all subgroups are verified to respective intrinsic verify voltage levels, the methodology 1000 can proceed to reference point A. At this point, methodology 1000 can end.

Figure 11:
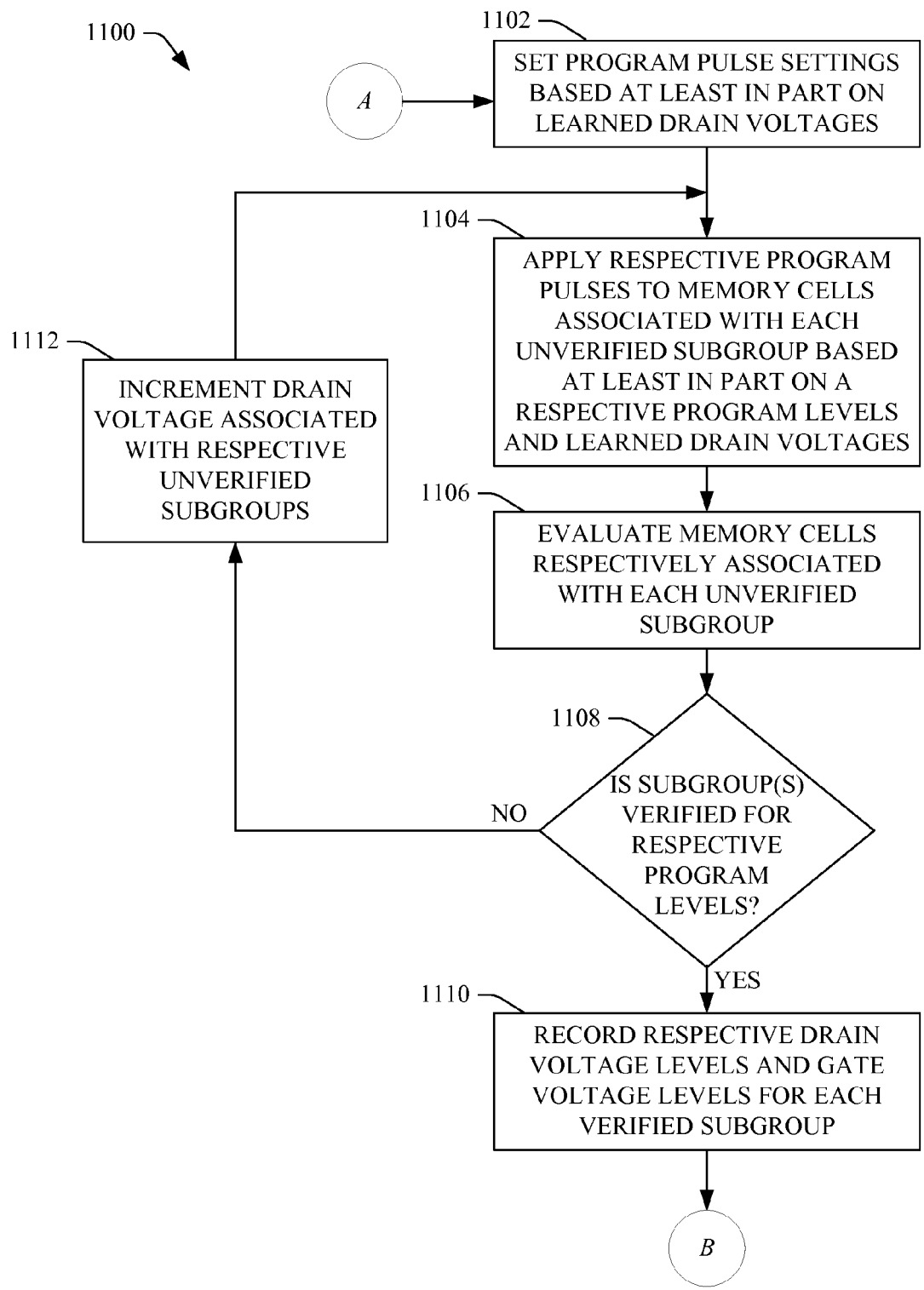
FIG. 11 depicts a methodology that can perform a first phase of programming to facilitate multi-phase programming of data in a memory in accordance with an aspect of the disclosed subject matter.

FIG. 11 depicts a methodology 1100 that can perform a first phase of programming to facilitate multi-phase programming of data in a memory in accordance with an aspect of the disclosed subject matter. The first phase of programming can facilitate programming memory cells 106 respectively associated with specified subgroups (e.g., associated with specified data levels) to increase the charge level of the memory cells 106 to respective intrinsic verify voltage levels related to respective subgroups by varying drain voltage levels, as desired, during the first phase programming process to facilitate beginning the programming of received data. The received data being programmed and stored in the memory component 102 can be re-arranged in accordance with a predefined program pattern 200 and stored in a buffer component to facilitate reducing bit disturb. In an aspect, the methodology 1100 can proceed from the end of the program learn associated with methodology 1000 where, for instance, methodology 1100 can proceed from reference point A of methodology 1000.

At 1102, program parameters related to the first phase of multi-phase programming can be set based at least in part on the learned drain voltage levels. In an aspect, program parameters, such as an initial gate voltage, initial drain voltage, a source voltage, and a pulse width, can be set to respective predefined values to facilitate increasing the respective charge levels for the memory cells 106 respectively associated with each subgroup to respective intrinsic verify voltage levels based at least in part on the respective data level and respective learned drain voltage levels. The subgroups can comprise subgroup 21, subgroup 2*x*, subgroup 31, subgroup 3*x*, subgroup 41, subgroup 4*x*, for example. The drain voltage for subgroup 21 initially can be set to a specified voltage level that is a specified amount lower than the learned drain voltage for subgroup 21 associated with data level 2, and subgroup 2*x* (e.g., related to 22, 23, and 24) initially can be set to a specified voltage level that is a disparate specified amount lower than the learned drain voltage for subgroup 21 (e.g., the drain voltage level for subgroup 2*x* can be lower than the drain voltage level for subgroup 21); the drain voltage for subgroup 31 initially can be set to a specified voltage level that is a specified amount lower than the learned drain voltage for subgroup 31 associated with data level 3, and subgroup 3*x* (e.g., related to 32, 33, and 34) initially can be set to a specified voltage level that is a disparate specified amount lower than the learned drain voltage for subgroup 31 (e.g., the drain voltage level for subgroup 3*x* can be lower than the drain voltage level for subgroup 31); and the drain voltage for subgroup 41 initially can be set to a specified voltage level that is a specified amount lower than the learned drain voltage for subgroup 41 associated with data level 4, and subgroup 4*x* (e.g., related to 42, 43, and 44) initially can be set to a specified voltage level that is a disparate specified amount lower than the learned drain voltage for subgroup 41 (e.g., the drain voltage level for subgroup 4*x* can be lower than the drain voltage level for subgroup 41). Thus, there can be six separate drain voltages employed during the first phase of programming.

A blank Vt bitmap per bit can be run (e.g., generated) and can be stored in the old Vt array 112. The subgroup buffer components can be loaded with the received data based at least in part on the data level of the respective bits of data and the program pattern 200. For instance, in subgroup 21 buffer component 114, bits that are 21 can be set to 0 and all other bits (e.g., bits for 22, 23, 24, 31, 32, 33, 34, 41, 42, 43, 44) can be set to 1, where, during programming, the bits set to 0 can receive the program pulse(s) associated with subgroup 21, and the bits set to 1 will not receive the program pulse(s) associated with subgroup 21. The other subgroup buffer components, subgroup 2*x* buffer component 116, subgroup 31 buffer component 118, subgroup 3*x* buffer component 120, subgroup 41 buffer component 122, subgroup 4*x* buffer component 124, can have data loaded and stored therein in a similar and corresponding fashion as described above with regard to subgroup 21 buffer component 114.

At 1104, respective first program pulses can be applied to selected memory cells 106 respectively associated with each subgroup to program the selected memory cells 106 based at least in part on the respective program parameters, including respective drain voltage levels related to each subgroup. At 1106, the memory cells 106 for each subgroup can be evaluated to facilitate determining whether a subgroup(s) is verified. In an aspect, the MP program component 108 can measure (e.g., single read) and evaluate the memory cells 106 associated with each subgroup to facilitate determining whether one or more subgroups are verified as meeting respective intrinsic verify voltage levels (e.g. having a charge level that meets or exceed a respective intrinsic verify level).

At 1108, a determination can be made regarding whether any subgroup is verified according to its corresponding intrinsic verify voltage level (e.g., memory cell(s) 106 associated with a subgroup is charged at least up to the intrinsic verify voltage level). The verify can be performed using a single read measurement of the selected memory cells 106. If all or at least a portion of the subgroups are verified, at 1110, respective drain voltage levels and gate voltage levels for each subgroup that is verified as a pass to the respective intrinsic verify voltage level can be recorded. When all subgroups of memory cells are verified as a pass to respective intrinsic verify voltage levels, the first phase of programming can be complete. In such instance, the methodology 1100 can proceed to reference point B (e.g., to perform the second phase of programming).

If, at 1108, it is determined that one or more subgroups is not verified, at 1112, a drain voltage level(s) respectively associated with a subgroup(s) that is not verified can be incremented. In an aspect, a respective drain voltage level(s) can be incremented by a predetermined amount of voltage (e.g., 0.1 v). At this point, the methodology 1100 can return to reference numeral 1104, and methodology 1100 can proceed from that point.

To facilitate determining whether additional programming is to be performed, after a program pulse is applied, a Vt bitmap can be run and stored in the new Vt array 126. For any subgroup that is verified, the bits in the subgroup buffer component for that subgroup can be set to 1 in the new Vt array 126; and for any subgroup that is not verified, the bits for the data state that the subgroup relates (e.g., subgroup 21 relates to data state 21) can be set to 0 to facilitate additional program pulsing of those bits. A delta Vt, which can be the difference between the new Vt array and the old Vt array, can be determined and recorded. The Vt distribution for the subgroups can be read, where the current level between the drain and source can be used to facilitate reading the Vt distribution.

When all subgroups are verified to respective intrinsic verify voltage levels, the methodology 1100 can proceed to reference point B. At this point, methodology 1100 can end.

Figure 12:
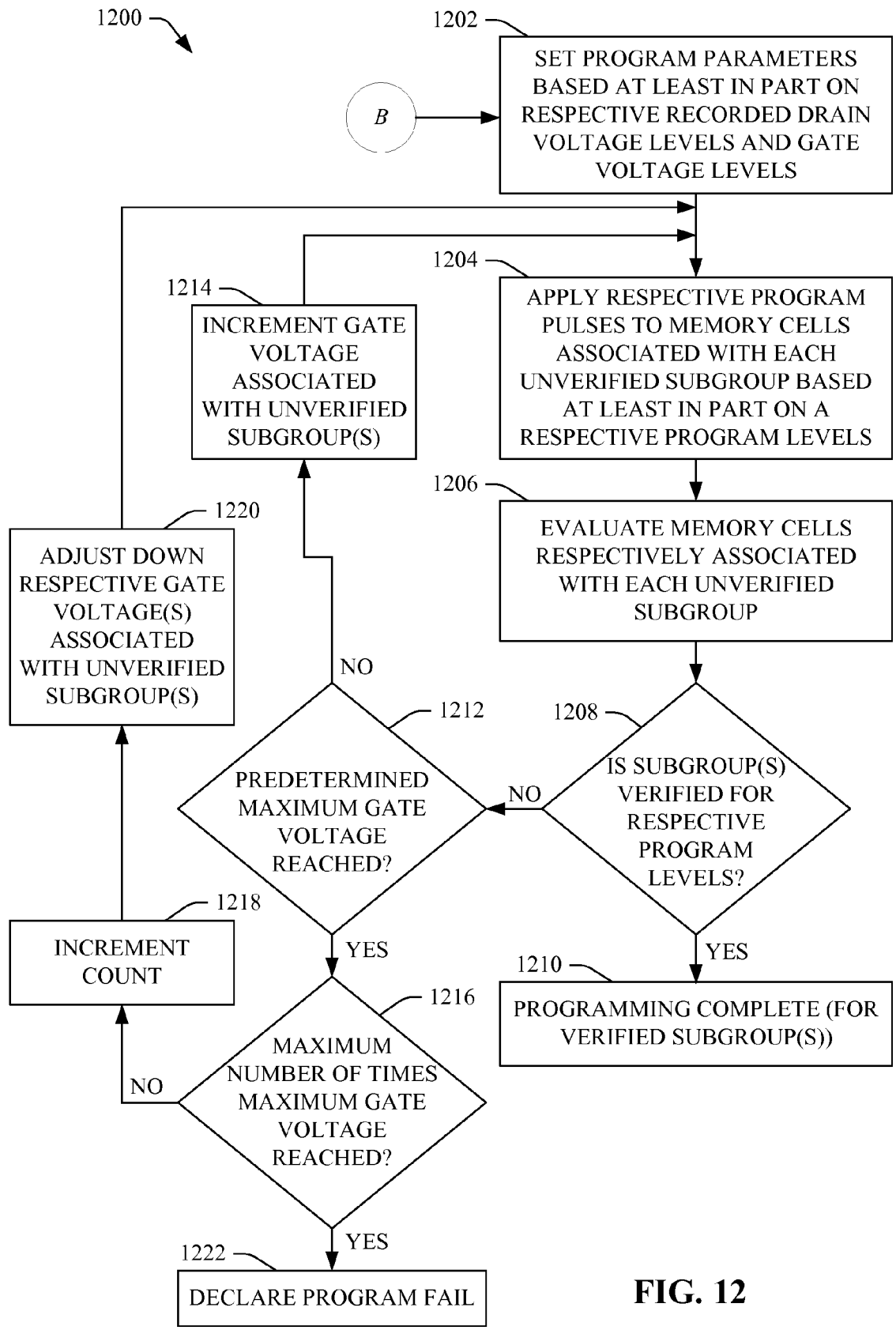
FIG. 12 illustrates a methodology that can perform a second phase of programming to facilitate multi-phase programming of data in a memory in accordance with an aspect of the disclosed subject matter.

FIG. 12 depicts a methodology 1200 that can perform a second phase of programming to facilitate multi-phase programming of data in a memory in accordance with an aspect of the disclosed subject matter. The second phase of programming can facilitate programming memory cells 106 respectively associated with specified subgroups (e.g., associated with specified data levels) to increase the charge level of the memory cells 106 to respective final verify voltage levels related to respective subgroups by varying gate voltage levels, as desired, during the second phase programming process to facilitate completing programming of received data. The received data being programmed and stored in the memory component 102 can be re-arranged in accordance with a predefined program pattern 200 and stored in a buffer component to facilitate reducing bit disturb. In an aspect, the methodology 1200 can proceed from the end of the first programming phase associated with methodology 1100, where, for instance, methodology 1200 can proceed from reference point B of methodology 1100.

At 1202, program parameters related to the second phase of multi-phase programming can be set based at least in part on the recorded drain voltage levels and gate voltage levels from the end of the first programming phase. In an aspect, program parameters, such as an initial gate voltage, initial drain voltage, a source voltage, and a pulse width, can be set to respective predefined values to facilitate increasing the respective charge levels for the memory cells 106 respectively associated with each subgroup (e.g., subgroup 21, subgroup 2x, subgroup 31, subgroup 3x, subgroup 41, subgroup 4x) to respective final verify voltage levels based at least in part on respective data levels. The drain voltage level and gate voltage level for subgroup 21 recorded at the point of verification from the first programming phase can be utilized as the initial drain voltage level and initial gate voltage level for subgroup 21; the drain voltage level and gate voltage level for subgroup 2x recorded at the point of verification from the first programming phase can be utilized as the initial drain voltage level and initial gate voltage level for subgroup 2x; the drain voltage level and gate voltage level for subgroup 31 recorded at the point of verification from the first programming phase can be utilized as the initial drain voltage level and initial gate voltage level for subgroup 31; the drain voltage level and gate voltage level for subgroup 3x recorded at the point of verification from the first programming phase can be utilized as the initial drain voltage level and initial gate voltage level for subgroup 3x; the drain voltage level and gate voltage level for subgroup 41 recorded at the point of verification from the first programming phase can be utilized as the initial drain voltage level and initial gate voltage level for subgroup 41; and the drain voltage level and gate voltage level for subgroup 4x recorded at the point of verification from the first programming phase can be utilized as the initial drain voltage level and initial gate voltage level for subgroup 4x.

A blank Vt bitmap per bit can be run (e.g., generated) and can be stored in the old Vt array 112. The subgroup buffer components can be loaded with the received data based at least in part on the data level of the respective bits of data and the program pattern 200. For instance, in subgroup 21 buffer component 114, bits that are 21 can be set to 0 and all other bits (e.g., bits for 22, 23, 24, 31, 32, 33, 34, 41, 42, 43, 44) can be set to 1, where, during programming, the bits set to 0 can receive the program pulse(s) associated with subgroup 21, and the bits set to 1 will not receive the program pulse(s) associated with subgroup 21. The other subgroup buffer components, subgroup 2x buffer component 116, subgroup 31 buffer component 118, subgroup 3x buffer component 120, subgroup 41 buffer component 122, subgroup 4x buffer component 124, can have data loaded and stored therein in a similar and corresponding fashion as described above with regard to subgroup 21 buffer component 114.

At 1204, respective first program pulses can be applied to selected memory cells 106 respectively associated with each subgroup to program the selected memory cells 106 based at least in part on the respective program parameters, including respective drain voltage levels and gate voltage levels related to each subgroup. At 1206, the memory cells 106 for each subgroup can be evaluated to facilitate determining whether a subgroup(s) is verified. In an aspect, the MP program component 108 can measure (e.g., perform single read) evaluate the memory cells 106 associated with each subgroup to facilitate determining whether one or more subgroups are verified as meeting respective final verify voltage levels (e.g. having a charge level that meets or exceed a respective final verify level).

At 1208, a determination can be made regarding whether any subgroup is verified according to its corresponding final verify voltage level (e.g., memory cell(s) 106 associated with a subgroup is charged at least up to a corresponding final verify voltage level). In an aspect, the verify can be performed using a single read measurement of the selected memory cells 106. If all of the subgroups are verified, the second phase of programming can be complete, which can complete programming of the received data.

If, at 1208, it is determined that one or more subgroups of memory cells is/are verified as a pass to the respective final verify voltage level, at 1210, programming can be complete with regard to any subgroup of memory cells that is verified as a pass to the respective final verify voltage level. If, at 1208, it is determined that a subgroup(s) of memory cells is not verified as a pass to the final verify voltage level, at 1212, a determination can be made regarding whether a predetermined maximum gate voltage level has been reached.

If, at 1212, it is determined that the predetermined maximum gate voltage level has not been reached with regard to an unverified subgroup(s) of memory cells, at 1214, a gate voltage level(s) respectively associated with a subgroup(s) of memory cells that is not verified can be incremented. In an aspect, a respective gate voltage level(s) for an unverified subgroup can be incremented by a predetermined amount of voltage (e.g., 0.1 v). At this point, the methodology 1200 can return to reference numeral 1204, and methodology 1200 can proceed from that point (e.g. respective program pulse(s), based at least in part on the respective adjusted gate voltage level(s), can be applied to an unverified subgroup(s) of memory cells 106, etc.).

In accordance with an aspect, to facilitate determining whether additional programming is to be performed, after a program pulse is applied, a Vt bitmap can be run and stored in the new Vt array 126. For any subgroup that is verified, the bits in the subgroup buffer component for that subgroup can be set to 1 in the new Vt array 126; and for any subgroup that is not verified, the bits for the data state that the subgroup relates (e.g., subgroup 21 relates to data state 21) can be set to 0 to facilitate additional program pulsing of those bits. A delta Vt, which can be the difference between the new Vt array and the old Vt array, can be determined and recorded. The Vt distribution for the subgroups can be read, where the current level between the drain and source can be used to facilitate reading the Vt distribution.

If, at 1212, it is determined that the predetermined maximum gate voltage level is reached, at 1216, a determination can be made regarding whether the predetermined maximum gate voltage has been reached a predetermined number of times. If it is determined that the predetermined maximum gate voltage has not been reached a predetermined maximum number of times, at 1218, a count related to the number of times the predetermined maximum gate voltage has been reach can be incremented (e.g., incremented by 1).

At 1220, the respective gate voltage level can be adjusted down to a predetermined voltage level, and programming can continue with regard to an unverified subgroup(s). For instance, if it is determined that the predetermined gate voltage level has not been reached a predetermined maximum number of times (e.g. 1 time, 2 times, 3 times, . . . ), the MP program component 108 can facilitate adjusting the gate voltage level down from the maximum gate voltage level to a desired gate voltage level (e.g., 200 mv, 400 mv, 600 mv, etc., lower than the maximum gate voltage level). At this point, the methodology 1200 can return to reference numeral 1204, and methodology 1200 can proceed from that point (e.g., respective program pulse(s), based at least in part on the respective adjusted gate voltage level(s), can be applied to an unverified subgroup(s) of memory cells 106, etc.)

If, at 1216, it is determined that the predetermined maximum gate voltage level has been reached a predetermined maximum number of times, at 1222, a program fail can be declared. In an aspect, the MP program component 108 can determine that a program fail has occurred if the gate voltage level has reached the predetermined gate voltage level a maximum number of times and there are one or more subgroups of memory cells 106 that are not verified as a pass to respective final verify voltage levels. It is to be appreciated and understood that, if a program fail is declared, the programming operation as a whole can be declared a fail, even with regard to subgroups of memory cells 106 that are verified as a pass to respective final verify voltage levels. In an aspect, when (and if) all subgroups of memory cells 106 are verified to respective final verify voltage levels, programming can be complete, as provided at reference numeral 1210.

Figure 13:
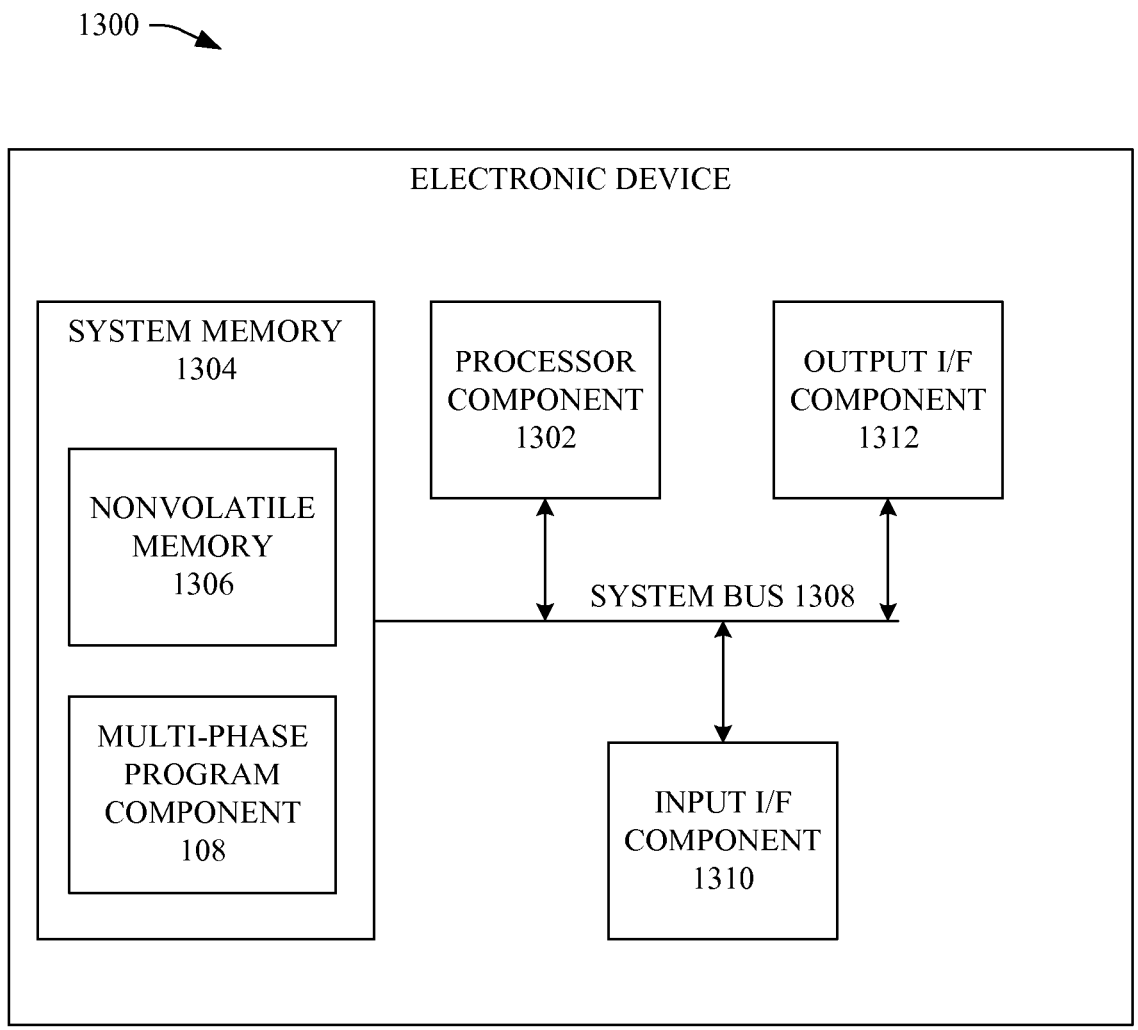
FIG. 13 is a block diagram of an exemplary, non-limiting electronic device that can employ a memory.

Referring to FIG. 13, illustrated is a block diagram of an exemplary, non-limiting electronic device 1300 that can comprise and/or incorporate system 100, system 400, memory device 500, and/or system 700, or a respective portion(s) thereof, and/or implement methodology 800, methodology 900, methodology 1000, methodology 1100, and/or methodology 1200, or respective portions thereof The electronic device 1300 can include, but is not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like.

Components of the electronic device 1300 can include, but are not limited to, a processor component 1302 (e.g., which can be and/or can include the same or similar functionality as processor component 702, as depicted in FIG. 7 and described herein), a system memory 1304, which can contain a nonvolatile memory 1306, and a system bus 1308 that can couple various system components including the system memory 1304 to the processor component 1302. In one aspect, the system memory 1304 can be and/or can comprise the same or similar functionality as respective components (e.g., memory component 102, including the MP program component 108) as more fully described herein, for example, with regard to system 100, system 400, memory device 500, system 700, etc. For instance, the system memory 1304 can include the MP program component 108. In another aspect, the system bus 1308 can be comprised of any of several types of bus structure(s) including, but not limited to, a memory bus, memory controller, peripheral bus, external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Electronic device 1300 can typically include a variety of computer readable media. Computer readable media can be any available media that can be accessed by the electronic device 1300. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 1306 (e.g., flash memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1300. Communication media typically embodies computer readable instructions, data structures, program modules or other data in a modulated data signal such as a carrier wave or other transport mechanism and includes any information delivery media.

The system memory 1304 can include computer storage media in the form of volatile (e.g., SRAM) and/or nonvolatile memory 1306 (e.g. flash memory), where the nonvolatile memory 1306 can be removable media or non-removable media. A basic input/output system (BIOS), containing the basic routines that can facilitate transferring information between elements within electronic device 1300, such as during start-up, can be stored in the system memory 1304. The system memory 1304 typically also can contain data and/or program modules that can be accessible to and/or presently be operated on by the processor component 1302. By way of example, and not limitation, the system memory 1304 can also include an operating system(s), application programs, other program modules, and program data.

The nonvolatile memory 1306 can be removable or non-removable. For example, the nonvolatile memory 1306 can be in the form of a removable memory card or a USB flash drive. In accordance with one aspect, the nonvolatile memory 1306 can include flash memory (e.g., single-bit flash memory, multi-bit flash memory), ROM, PROM, EPROM, EEPROM, or NVRAM (e.g., FeRAM), or a combination thereof, for example. Further, a flash memory can comprise NOR flash memory and/or NAND flash memory.

A user can enter commands and information into the electronic device 1300 through input devices (not shown) such as a keypad, microphone, tablet, or touch screen although other input devices can also be utilized. These and other input devices can be connected to the processor component 1302 through input interface component 1310 that can be connected to the system bus 1308. Other interface and bus structures, such as a parallel port, game port or a universal serial bus (USB) can also be utilized. A graphics subsystem (not shown) can also be connected to the system bus 1308. A display device (not shown) can be also connected to the system bus 1308 via an interface, such as output interface component 1312, which can in turn communicate with video memory. In addition to a display, the electronic device 1300 can also include other peripheral output devices such as speakers (not shown), which can be connected through output interface component 1312.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

As utilized herein, terms "component," "system," "interface," and the like, can refer to a computer-related entity, either hardware, software (e.g. in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein can encompass a computer program accessible from any computer-readable device, carrier, or media. For example, computer readable media can include, but is not limited to, magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications can be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that employs multi-phase program of data in a memory component, comprising:
   the memory component comprising a plurality of memory cells to facilitate data storage; and
   a multi-phase program component that performs a first phase of programming by adjustment of respective drain voltage levels to program selected memory cells to respective intrinsic verify voltage levels based at least in part on respective programming subgroups associated with the selected memory cells and performs a second phase of programming by adjustment of respective gate voltage levels to program selected memory cells to respective final verify voltage levels based at least in part on the respective programming subgroups associated with the selected memory cells.

2. The system of claim 1, further comprising:
a scrambler component that scrambles incoming data to re-arrange the data so that the data is programmed to the selected memory cells in a predefined program pattern that facilitates at least one of reduction of a number of instances where a memory element of a selected memory cell with data level 1 is adjacent to a memory element of a same selected memory cell or a neighbor memory cell programmed to data level 4, or increase a number of instances that a memory element of a selected memory cell with a particular data level is adjacent to another memory element of the selected memory cell or an adjacent memory cell having a data level that is a same data level, one data level higher, or one data level lower than the particular data level, to facilitate reducing bit disturb.

3. The system of claim 1, the multi-phase program component performs a program learn to determine respective drain voltage levels for selected programming subgroups, wherein initial drain voltage levels for the respective programming subgroups during the first phase of programming are determined based at least in part on the respective determined drain voltage levels for the selected programming subgroups.

4. The system of claim 3, the multi-phase program component applies respective first program pulses to memory cells respective associated with the selected programming subgroups and performs verification to determine whether any selected programming subgroup is verified to a respective intrinsic verify voltage level.

5. The system of claim 4, the multi-phase program component records a learned voltage drain level for any selected programming subgroup that is associated with memory cells programmed to a respective intrinsic verify voltage level, and after a program pulse is applied, iteratively increments a voltage drain level of any selected programming subgroup that is not verified to a respective intrinsic verify voltage level and iteratively applies at least one other program pulse, based at least in part on the incremented voltage drain level, to memory cells associated with any selected programming group that is not verified up to a predetermined maximum number of program pulses to facilitate learning respective drain voltage levels of selected programming subgroups.

6. The system of claim 1, the multi-phase program component sets respective program parameters for the respective programming subgroups and applies respective program pulses, based at least in part on the respective learned drain voltage levels, to the selected memory cells respectively associated with the programming subgroups.

7. The system of claim 6, the multi-phase program component evaluates the respective charge levels of the selected memory cells to determine whether any programming subgroup is verified to a respective intrinsic verify voltage level.

8. The system of claim 7, the multi-phase program component records a drain voltage level and gate voltage level of any programming subgroup that is verified to a respective intrinsic verify voltage level.

9. The system of claim 7, after the respective program pulses are applied, the multi-phase program component increments a drain voltage level of any programming subgroup that is not verified to a respective intrinsic verify voltage level and iteratively applies at least one more program pulse to any programming subgroup that is not verified to the respective intrinsic verify voltage level.

10. The system of claim 1, the multi-phase program component sets program parameters comprising respective drain voltage levels and respective gate voltage levels for the programming subgroups, based at least in part on recorded drain voltage levels and gate voltage levels at completion of the first phase of programming, and applies respective program pulses, based at least in part on the respective gate voltage levels, to the selected memory cells respectively associated with the programming subgroups.

11. The system of claim 10, the multi-phase program component evaluates the respective charge levels of the selected memory cells to determine whether any programming subgroup is verified to a respective final verify voltage level.

12. The system of claim 10, after the respective program pulses are applied, the multi-phase program component increments a gate voltage level of any programming subgroup that is not verified to a respective final verify voltage level and iteratively applies at least one more program pulse to any programming subgroup that is not verified to the respective final verify voltage level.

13. An electronic device comprising the system of claim 1.

14. The electronic device of claim 13, the electronic device is one of a computer, a cellular phone, a digital phone, a video device, a smart card, a personal digital assistant, a television, an electronic game, a digital camera, an electronic organizer, an audio player, an audio recorder, an electronic device associated with digital rights management, a Personal Computer Memory Card International Association (PCMCIA) card, a trusted platform module (TPM), an electronic control unit associated with a motor vehicle, a global positioning satellite (GPS) device, an electronic device associated with an airplane, an electronic device associated with an industrial control system, a Hardware Security Module (HSM), a set-top box, a secure memory device with computational capabilities, or an electronic device with at least one tamper-resistant chip.

15. A method for multi-phase programming of data in a memory, comprising:
applying respective program pulses to selected memory cells respectively associated with data-level subgroups based at least in part on respective drain voltage levels associated with the data-level subgroups until the selected memory cells are verified to respective intrinsic verify voltage levels associated with the respective data-level subgroups, wherein the respective drain voltage levels are incremented between program pulses for any data-level subgroup that is not verified after a program pulse is applied; and
applying respective program pulses to selected memory cells respectively associated with data-level subgroups based at least in part on respective gate voltage levels associated with the data-level subgroups until the selected memory cells are verified to respective final verify voltage levels associated with the respective data-level subgroups, wherein the respective gate voltage levels are incremented between program pulses for any data-level subgroup that is not verified after a program pulse is applied.

16. The method of claim 15, further comprising:
scrambling received data to re-arrange the data based at least in part on a predefined program pattern that facilitates at least one of reducing a number of instances where a memory element of a selected memory cell with a lowest data level is adjacent to a memory element of a same selected memory cell or a neighbor memory cell programmed to a highest data level, or increase a number of instances that a memory element of a selected memory cell with a particular data level is adjacent to another memory element of the selected memory cell or an adjacent memory cell having a data level that is a same data level, or not more than one data level higher or one data level lower, than the particular data level; and programming the data to the selected memory cells in accordance with the predefined program pattern to facilitate reducing bit disturb.

17. The method of claim 15, further comprising:

setting respective program parameters comprising initial drain voltage levels respectively associated with a subset of data-level subgroups;

applying a first program pulse to a subset of memory cells respectively associated with the subset of data-level subgroups based at least in part on the respective initial drain voltage levels; and determining whether any data-level subgroup is verified as having respective memory cells charged to a charge level that at least meets a respective intrinsic verify voltage level to facilitate learning respective drain voltage levels for a subset of data-level subgroups to facilitate determining initial drain voltage levels to be employed by the data-level subgroups during a first phase of multi-phase programming.

18. The method of claim 17, further comprising:

recording a drain voltage level for selected memory cells associated with a data-level subgroup that is verified as having respective memory cells charged to a charge level that at least meets a respective intrinsic verify voltage level.

19. The method of claim 17, further comprising:

determining whether a predetermined number of program pulses have been applied, if it is determined that at least one data-level subgroup is not verified as having respective memory cells charged to a charge level that at least meets a respective intrinsic verify voltage level; and at least one of:
- declaring a program learn fail if it is determined that a predetermined number of program pulses has been applied, or
- incrementing a respective drain voltage level for each data-level subgroup that is not verified as having respective memory cells charged to a charge level that at least meets a respective intrinsic verify voltage level,
  - setting respective program parameters comprising an incremented drain voltage level respectively associated with each data-level subgroup that is not verified, and
  - applying at least one more respective program pulse to selected memory cells respectively associated with each data-level subgroup that is not verified, based at least in part on the incremented drain voltage level.

20. The method of claim 15, further comprising:

setting respective program parameters comprising initial drain voltage levels respectively associated with the respective data-level subgroups, where the initial drain voltage levels are determined based at least in part on respective learned drain voltage levels of a subset of the data-level subgroups;

applying a first program pulse to selected memory cells respectively associated with the data-level subgroups based at least in part on the respective initial drain voltage levels; and determining whether any data-level subgroup is verified as having respective memory cells charged to a charge level that at least meets a respective intrinsic verify voltage level to facilitate performing a first phase of programming data in the memory.

21. The method of claim 20, further comprising:

recording a drain voltage level and a gate voltage level for selected memory cells associated with a data-level subgroup that is verified as having respective memory cells charged to a charge level that at least meets a respective intrinsic verify voltage level.

22. The method of claim 20, further comprising:

incrementing a respective drain voltage level for each data-level subgroup that is not verified as having respective memory cells charged to a charge level that at least meets a respective intrinsic verify voltage level;

setting respective program parameters comprising an incremented drain voltage level respectively associated with each data-level subgroup that is not verified; and applying at least one more respective program pulse to selected memory cells respectively associated with each data-level subgroup that is not verified, based at least in part on the incremented drain voltage level.

23. The method of claim 15, further comprising:

setting respective program parameters comprising initial gate voltage levels and initial drain voltage levels respectively associated with the data-level subgroups, where the initial gate voltage levels and the initial drain voltage levels are respective final voltage levels from a first phase of programming to facilitate performing a second phase of programming data in the memory;

applying a first program pulse to selected memory cells respectively associated with the data-level subgroups based at least in part on the respective initial gate voltage levels and the initial drain voltage levels; and determining whether any data-level subgroup is verified as having respective memory cells charged to a charge level that at least meets a respective final verify voltage level to facilitate performing the second phase of programming data in the memory.

24. The method of claim 23, further comprising:

determining whether the respective gate voltage level for each data-level subgroup, which is not verified as having respective memory cells charged to a charge level that at least meets a respective final verify voltage level, has reached a predetermined maximum gate voltage.

25. The method of claim 24, further comprising:

incrementing a respective gate voltage level for each data-level subgroup that is not verified as having respective memory cells charged to a charge level that at least meets a respective final verify voltage level, and for which the predetermined maximum gate voltage is not reached;

setting respective program parameters comprising an incremented gate voltage level respectively associated with each data-level subgroup that is not verified; and applying at least one more respective program pulse to selected memory cells respectively associated with each data-level subgroup that is not verified, based at least in part on the incremented gate voltage level.

26. The method of claim 24, further comprising:

determining whether the predetermined maximum gate voltage level has been reached a predetermined maximum number of times, if it is determined that the predetermined maximum gate voltage level is reached for a data-level subgroup(s) that is not verified as having respective memory cells charged to a charge level that at least meets a respective final verify voltage level.

27. The method of claim 26, further comprising:

incrementing a count related to a number of times the predetermined maximum gate voltage is reached, if it determined that the predetermined maximum gate voltage level has not been reached the predetermined maximum number of times; and adjusting a respective gate voltage level for each data-level subgroup, which is not verified as having respective memory cells charged to a charge level that at least meets a respective final verify voltage level, to a respective predefined gate voltage level that is lower than the predetermined maximum gate voltage level by a specified amount of voltage;

setting respective program parameters comprising an incremented gate voltage level respectively associated with each data-level subgroup that is not verified; and applying at least one more respective program pulse to selected memory cells respectively associated with each data-level subgroup that is not verified, based at least in part on the respective adjusted gate voltage level.

28. The method of claim 26, further comprising:

declaring a program fail when the predetermined maximum gate voltage for at least one data-level subgroup is reached the predetermined maximum number of times.

29. The method of claim 23, further comprising:

ending the second phase of programming data in the memory when all data-level subgroups are verified as having respective memory cells charged to a charge level that at least meets a respective final verify voltage level.

* * * * *